US008242534B2

(12) United States Patent
Moroda et al.

(10) Patent No.: US 8,242,534 B2
(45) Date of Patent: Aug. 14, 2012

(54) SEMICONDUCTOR DEVICE AND MANUFACTURING METHOD THEREOF

(75) Inventors: Aki Moroda, Kanagawa (JP); Kosuke Miyazaki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 15 days.

(21) Appl. No.: 13/018,532

(22) Filed: Feb. 1, 2011

(65) Prior Publication Data

US 2011/0220960 A1 Sep. 15, 2011

(30) Foreign Application Priority Data

Mar. 12, 2010 (JP) ................................ 2010-055339

(51) Int. Cl.
*H01L 29/66* (2006.01)

(52) U.S. Cl. . 257/120; 257/107; 257/115; 257/E29.215; 257/E21.392; 438/134

(58) Field of Classification Search .................. 257/107, 257/115, 120, E29.215, E21.392; 438/134
See application file for complete search history.

(56) References Cited

FOREIGN PATENT DOCUMENTS

JP 8-107200 A 4/1996

*Primary Examiner* — Tan N Tran
(74) *Attorney, Agent, or Firm* — Mattingly & Malur, PC

(57) ABSTRACT

The present invention improves the performance of a semiconductor device formed with a triac. A thyristor is formed between a back surface electrode and an electrode by p-type semiconductor regions, an n-type substrate region, p-type semiconductor regions and an n-type semiconductor region. A thyristor is formed therebetween by the p-type semiconductor regions, the n-type substrate region, the p-type semiconductor regions and an n-type semiconductor region. The two thyristors are opposite in the direction of currents flowing between the back surface electrode and the electrode. The p-type semiconductor region of a high impurity concentration is formed so as to be internally included in the p-type semiconductor region of a low impurity concentration. The p-type semiconductor region of a low impurity concentration is interposed between the p-type semiconductor region of a high impurity concentration and the n-type substrate region.

21 Claims, 16 Drawing Sheets

SEMICONDUCTOR DEVICE AND MANUFACTURING METHOD THEREOF

CROSS-REFERENCE TO RELATED APPLICATIONS

The disclosure of Japanese Patent Application No. 2010-55339 filed on Mar. 12, 2010 including the specification, drawings and abstract is incorporated herein by reference in its entirety.

BACKGROUND OF THE INVENTION

The present invention relates to a semiconductor device and a manufacturing method thereof, and particularly to a technology effective when applied to a semiconductor device equipped with a triac and a manufacturing method thereof.

The triac is of such a device that two complementary thyristors are coupled in antiparallel with each other to thereby allow currents to flow bidirectionally. The triac is used for control of alternating current and the like.

A technique related to a planar type triac has been described in Japanese Patent Laid-Open No. Hei 8 (1996)-107200 (patent document 1).

SUMMARY OF THE INVENTION

According to discussions made by the present inventors, the following have been found out.

A triac is a device used for AC control or the like. It is desired that since accurate control is required for the triac, its performance (switching performance) is enhanced as much as possible. As the characteristics whose improvements are desired in particular, there are known suppression (prevention) of a failure in commutation and an improvement in breakdown voltage.

The failure in commutation is of the phenomenon that it occurs due to the fact that the triac is turned on unintentionally without being inputted with a gate signal, and the triac is energized at the stage where it is not to be originally energized. The triac therefore needs to prevent the occurrence of the commutation failure as much as possible. When the configuration of the entire circuit in which perform AC control with the triac is devised (e.g., a CR absorber is coupled in parallel to the triac) to prevent the failure in commutation, an increase in the number of elements (e.g., a resistor and a capacitor that configure the CR absorber) accompanying it results in an increase in the manufacturing cost and upsizing of the entire electronic apparatus. It is therefore desirable to make it hard to cause the commutation failure by devising the triac itself formed in a semiconductor device (semiconductor substrate). It is also desired that the triac itself formed in the semiconductor device (semiconductor substrate) is devised because large current flows through the triac and the voltage to be applied thereto is also high, thereby achieving a triac's high breakdown voltage.

An object of the present invention is to provide a technology capable of improving the performance of a semiconductor device.

The above, other objects and novel features of the present invention will become apparent from the description of the present specification and the accompanying drawings.

A summary of typical embodiments of the inventions disclosed in the present application will be described in brief as follows:

A semiconductor device according to the typical embodiment is provided in which a p-type semiconductor region that forms a triac is divided to be formed into a high-concentration p-type semiconductor region and a low-concentration p-type semiconductor region.

A semiconductor device manufacturing method according to the typical embodiment is provided in which when a p-type semiconductor region for forming a triac in a semiconductor substrate is formed, the p-type semiconductor region is divided to be formed into a high-concentration p-type semiconductor region and a low-concentration p-type semiconductor region.

Advantageous effects obtained by a typical embodiment of the inventions disclosed in the present application will briefly be explained in the following:

According to the typical embodiment, the performance of a semiconductor device can be enhanced.

DETAILED DESCRIPTION OF THE PREFERRED EMBODIMENTS

Figure 1:
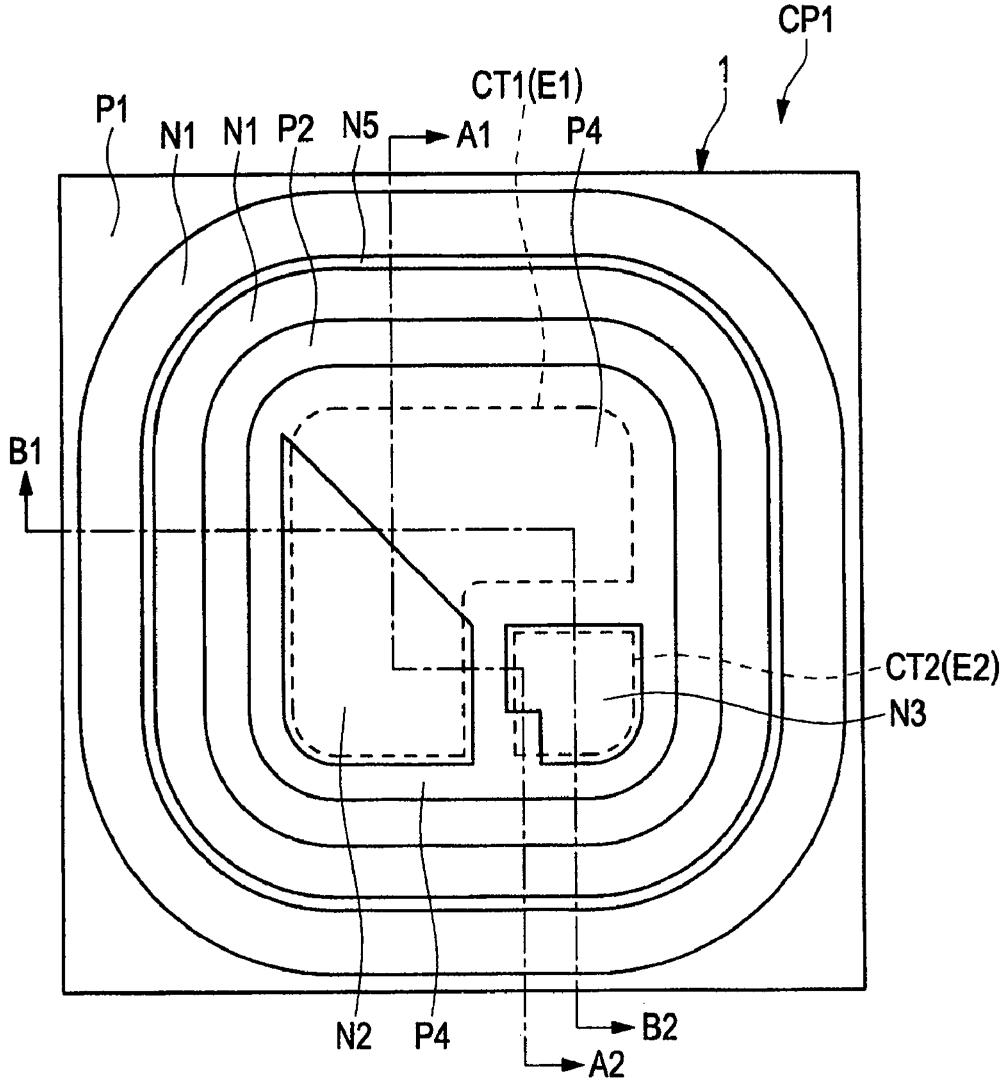
FIG. 1 is a plan view of a semiconductor device showing one embodiment of the present invention.

Whenever circumstances require it for convenience in the following embodiments, the subject matter will be described by being divided into a plurality of sections or embodiments. However, unless otherwise specified in particular, they are not irrelevant to one another. One thereof has to do with modifications, details, supplementary explanations and the like of some or all of the other. When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle. It is further needless to say that components (including element or factor steps, etc.) employed in the following embodiments are not always essential unless otherwise specified in particular and considered to be definitely essential in principle. Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

Preferred embodiments of the present invention will hereinafter be described in detail based on the accompanying drawings. Incidentally, the same reference numerals are respectively attached to components having the same functions in all the drawings for describing the embodiments, and their repetitive description will be omitted. In the following embodiments, the description of the same or similar components will not be repeated in principle unless needed.

In the drawings used in the embodiments, some hatching may be omitted to make it easy to read the drawings even in the case of sectional views. Some hatching may be provided to make it easy to read the drawings even in the case of plan views.

(Embodiment)

<Structure of Semiconductor Device>

Figure 2:
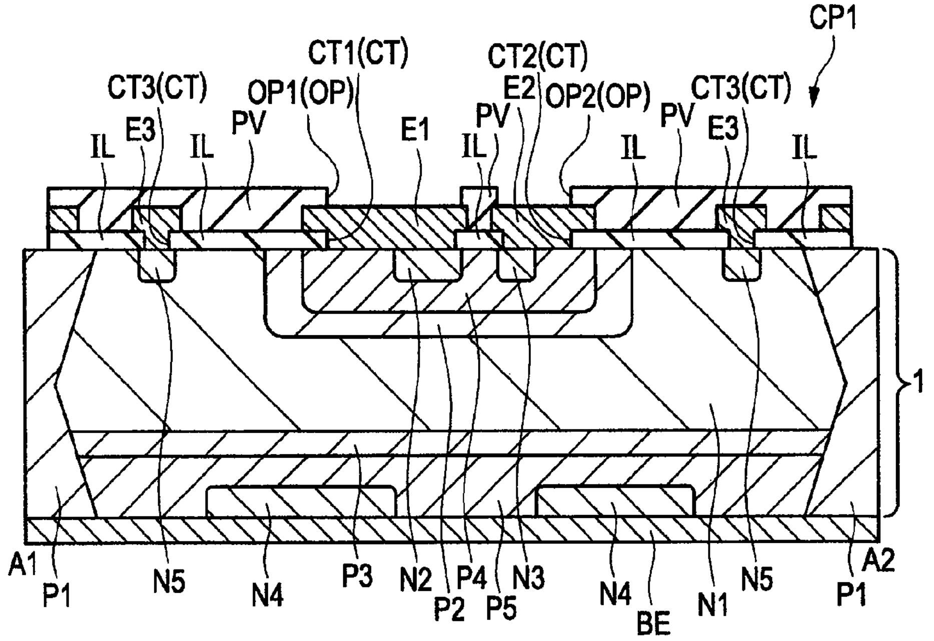
FIG. 2 is a sectional view of the semiconductor device shown in FIG. 1.
Figure 3:
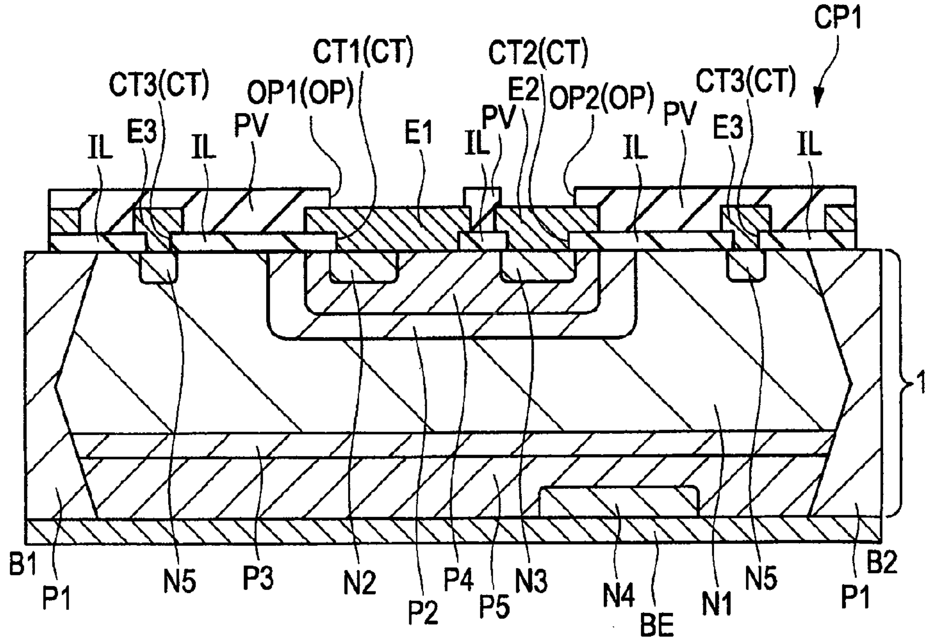
FIG. 3 is a sectional view of the semiconductor device shown in FIG. 1.

FIG. 1 is a plan view (plan layout diagram) of a semiconductor device CP1 showing one embodiment of the present invention, i.e., a semiconductor device CP1 having a triac (TRIAC) herein, and FIGS. 2 and 3 are respectively fragmentary sectional views thereof. A sectional view taken along line A1-A2 of FIG. 1 corresponds approximately to FIG. 2, and a sectional view taken along line B1-B2 of FIG. 1 corresponds approximately to FIG. 3, respectively. FIG. 1 is shown as seen through insulating films PV and IL and electrodes E1, E2 and E3 and show a planar layout of p-type semiconductor regions P1, P2 and P4, an n-type substrate region N1 and n-type semiconductor regions N2, N3 and N5 in a major surface of a semiconductor substrate 1 which forms or configures the semiconductor device CP1. In FIG. 1, a contact hole CT1 for the electrode E1 and a contact hole CT2 for the electrode E2 are shown with dotted lines to facilitate understanding thereof.

The semiconductor device (semiconductor chip) CP1 of the present embodiment shown in FIGS. 1 through 3 is a semiconductor device having a triac, i.e., a semiconductor device having a bidirectional thyristor, which corresponds to one in which the triac is formed in the semiconductor substrate 1 that configures the semiconductor device, i.e., one in which the bidirectional thyristor is formed in the semiconductor substrate 1 that configures the semiconductor device. The configuration of the semiconductor device CP1 according to the present embodiment will be explained specifically.

A p-type semiconductor region P1, a p-type semiconductor region P1, a p-type semiconductor region P2, a p-type semiconductor region P3, a p-type semiconductor region P4, a p-type semiconductor region P5, an n-type semiconductor region N2, an n-type semiconductor region N3, an n-type semiconductor region N4 and an n-type semiconductor region N5 are formed in the semiconductor substrate 1 that configure the semiconductor device CP1 of the present embodiment. These p-type semiconductor regions P1, P2, P3, P4 and P5 and n-type semiconductor regions N2, N3, N4 and N5 are formed by introducing (diffusing more specifically) impurities (p-type impurity such as boron for the p-type semiconductor regions P1, P2, P3, P4 and P5, and n-type impurity such as phosphorous for the n-type semiconductor regions N2, N3, N4 and N5) into the semiconductor substrate 1.

The semiconductor substrate 1 is of a semiconductor substrate (n-type semiconductor substrate) comprised of n-type monocrystalline silicon or the like. In the semiconductor substrate 1, a region (i.e., a region in which the impurity for the p-type semiconductor regions P1, P2, P3, P4 and P5 or the n-type semiconductor regions N2, N3, N4 and N5 is almost undiffused) which is not used as for the p-type semiconductor regions P1, P2, P3, P4 and P5 and n-type semiconductor regions N2, N3, N4 and N5, serves as an n-type substrate region (n-type semiconductor region) N1. Namely, the n-type substrate region N1 is configured by part of the semiconductor substrate 1. The n-type substrate region N1 corresponds to a region (substrate region) which nearly maintains an impurity state (n-type semiconductor state) of the semiconductor substrate 1 at the stage prior to the formation of the p-type semiconductor regions P1, P2, P3, P4 and P5 and the n-type semiconductor regions N2, N3, N4 and N5. The n-type substrate region N1 can also be assumed to be an n-type semiconductor region. The n-type substrate region N1 is interposed between the p-type semiconductor region P2 and the p-type semiconductor region P3. A combination of the n-type substrate region N1, p-type semiconductor regions P1, P2, P3, P4 and P5 and n-type semiconductor regions N2, N3, N4 and N5 takes on the entire semiconductor substrate 1.

These semiconductor regions (P1 through P5 and N1 through N5) will concretely be explained as follows:

The p-type semiconductor region (eighth semiconductor region) P1 is formed in an outer peripheral portion (outer peripheral region) of the semiconductor substrate 1 that configures the semiconductor device CP1 of the present embodiment and reaches from the front surface of the semiconductor substrate 1 to its back surface. Therefore, a portion (region) which comes into contact with each side surface of the semiconductor substrate 1, serves as the p-type semiconductor region P1. The n-type substrate region N1 is demarcated (defined) by the p-type semiconductor region P1. The n-type substrate region N1 has a periphery surrounded by the p-type semiconductor region P1 as viewed on a planar basis. Accordingly, the side surface of the n-type substrate region N1 is in contact with the p-type semiconductor region P1.

Incidentally, a major surface (first major surface) lying on the formed side of electrodes E1 and E2 to be described later, of two major surfaces of the semiconductor substrate 1, which are located on the sides opposite to each other, is called the front surface of the semiconductor substrate 1. A major surface (second major surface) lying on the formed side of back surface electrode BE is referred to as the back surface of the semiconductor substrate 1. The p-type semiconductor region (first semiconductor region) P2, the p-type semiconductor region (second semiconductor region) P4, the n-type semiconductor region (third semiconductor region) N2, the n-type semiconductor region (fourth semiconductor region) N3 and the n-type semiconductor region (ninth semiconductor region) N5 are formed on the side of the front surface (first major surface) of the semiconductor substrate 1. The p-type semiconductor region (seventh semiconductor region) P3, the p-type semiconductor region (fifth semiconductor region) P5 and the n-type semiconductor region (sixth semiconductor region) N4 are formed on the side of the back surface (second major surface) of the semiconductor substrate 1. The p-type semiconductor region P1 is in contact with the n-type substrate region N1 and the p-type semiconductor regions P3 and P5, but formed apart from the p-type semiconductor regions P2 and P4 and the n-type semiconductor regions N2, N3, N4 and N5.

The p-type semiconductor region P2 is formed in the vicinity of the center of the semiconductor substrate 1, which lies on the front surface side thereof. The p-type semiconductor region P2 is formed within the n-type substrate region N1 and formed so as to be surrounded with the n-type substrate region N1. Namely, the p-type semiconductor region P2 is formed so as to be internally included in the n-type substrate region N1. If another way of viewing is taken, the side surface of the p-type semiconductor region P2 and the bottom surface (bottom) thereof are in contact with the n-type substrate region N1, and the upper surface of the p-type semiconductor region P2 is exposed at the front surface of the semiconductor substrate 1. The p-type semiconductor region P2 is formed over a depth of, for example, about 20 μm to about 50 μm from the front surface of the semiconductor substrate 1.

While the p-type semiconductor region P4 is formed in the vicinity of the center of the semiconductor substrate 1, which lies on the front surface side thereof, it is formed within the p-type semiconductor region P2 and formed so as to be lapped or surrounded with the p-type semiconductor region P2. Namely, the p-type semiconductor region P4 is formed so as to be internally involved in the p-type semiconductor region P2. If another way of viewing is taken, the side surface of the p-type semiconductor region P4 and the bottom surface (bottom) thereof are in contact with the p-type substrate region P2, and the upper surface of the p-type semiconductor region P4 is exposed at the front surface of the semiconductor substrate 1. Therefore, the p-type semiconductor region P4 is not in contact with the n-type substrate region N1, and the p-type semiconductor region P2 is placed in a state of being interposed between the p-type semiconductor region P4 and the n-type substrate region N1.

The p-type semiconductor region P4 is formed shallower than the p-type semiconductor region P2. Namely, the depth (distance) from the front surface of the semiconductor substrate 1 to the bottom (bottom surface) of the p-type semiconductor region P4 is shallower (smaller) than the depth (distance) from the front surface of the semiconductor substrate 1 to the bottom (bottom surface) of the p-type semiconductor region P2. For example, the p-type semiconductor region P4 is formed over a depth of about 10 μm to about 30 μm from the front surface of the semiconductor substrate 1.

The p-type semiconductor region P4 is higher than the p-type semiconductor region P2 in impurity concentration (p-type impurity concentration). Therefore, the p-type semiconductor region P4 can be assumed to be a high-concentration p-type semiconductor region or a high-concentration p-type impurity diffusion region, whereas the p-type semiconductor region P2 can be assumed to be a low-concentration p-type semiconductor region or a low-concentration p-type impurity diffusion region. Since the p-type semiconductor region P4 has an impurity concentration higher than that of the p-type semiconductor region P2, the specific resistivity (specific resistance) of the p-type semiconductor region P4 is lower than that of the p-type semiconductor region P2.

While the n-type semiconductor region N2 and the n-type semiconductor region N3 are formed in the neighborhood of the center of the semiconductor substrate 1 on its front surface side, they are formed within the p-type semiconductor region P4 and formed so as to be wrapped up with the p-type semiconductor region P4. That is, the n-type semiconductor region N2 and the n-type semiconductor region N3 are formed so as to be internally included in the p-type semiconductor region P4. If another view is taken, the side surface and bottom surface (bottom) of the n-type semiconductor region N2, and the side surface and bottom surface (bottom) of the n-type semiconductor region N3 are in contact with the p-type semiconductor region P4. The upper surface of the n-type semiconductor region N2 and the upper surface of the n-type semiconductor region N3 are exposed at the front surface of the semiconductor substrate 1. However, the n-type semiconductor region N2 and the n-type semiconductor region N3 are formed apart from each other. Therefore, the n-type semiconductor region N2 and the n-type semiconductor region N3 are not in contact with each other, and the p-type semiconductor region P4 is placed in a state of being interposed between the n-type semiconductor region N2 and the n-type semiconductor region N3. Further, the n-type semiconductor region N2 and the n-type semiconductor region N3 are neither in contact with the p-type semiconductor region P2 nor in contact with the n-type substrate region N1. The p-type semiconductor region P4 is put in a state of being interposed between the n-type semiconductor region N2 and the p-type semiconductor region P2 and between the n-type semiconductor region N3 and the p-type semiconductor region P2.

The n-type semiconductor region N2 and the n-type semiconductor region N3 are formed shallower than the p-type semiconductor region P4. Namely, the depth (distance) from the front surface of the semiconductor substrate 1 to the bottom (bottom surface) of the n-type semiconductor region N2 is shallower (smaller) than the depth (distance) from the front surface of the semiconductor substrate 1 to the bottom (bottom surface) of the p-type semiconductor region P4, and the depth (distance) from the front surface of the semiconductor substrate 1 to the bottom (bottom surface) of the n-type semiconductor region N3 is shallower (smaller) than the depth (distance) from the front surface of the semiconductor substrate 1 to the bottom (bottom surface) of the p-type semiconductor region P4. For example, the n-type semiconductor regions N2 and N3 are formed over a depth of about 2 μm to about 20 μm from the front surface of the semiconductor substrate 1.

While the n-type semiconductor region N5 is formed on the front surface side of the semiconductor substrate 1, it is formed in part of a surface layer portion of the n-type substrate region N1 and formed so as to be wrapped up with the n-type substrate region N1 or internally involved in the n-type substrate region N1. If another way of viewing is taken, the side surface and bottom surface (bottom) of the n-type semiconductor region N5 are in contact with the n-type substrate region N1, and the upper surface of the n-type semiconductor region N5 is exposed at the front surface of the semiconductor substrate 1. The n-type semiconductor region N5 is set higher in impurity concentration than the n-type substrate region N1.

The n-type semiconductor region N5 is set to a depth of the same degree as the n-type semiconductor regions N2 and N3 and formed over, for example, a depth of about 2 μm to about 20 μm from the front surface of the semiconductor substrate 1. The n-type semiconductor region N5 is formed between the p-type semiconductor region P2 and the p-type semiconductor region P1. The n-type semiconductor region N5 is formed apart from the p-type semiconductor regions P1, P2 and P4 and the n-type semiconductor regions N2 and N3. Therefore, the n-type semiconductor region N5 is not in contact with any of the p-type semiconductor regions P1, P2 and P4 and the n-type semiconductor regions N2 and N3. As shown in FIG. 1, preferably, the n-type semiconductor region N5 is formed so as to surround the p-type semiconductor region P2 as viewed on a planar basis, e.g., it is formed to a ring-like planar shape that surrounds the p-type semiconductor region P2.

The p-type semiconductor region P3 and the p-type semiconductor region P5 are formed on the back surface side of the semiconductor substrate 1. Of the p-type semiconductor regions P3 and P5, the p-type semiconductor region P5 is formed in a region that comes into contact with the back surface of the semiconductor substrate 1, and the p-type semiconductor region P3 is formed on the side of the semiconductor substrate 1 more inner than the p-type semiconductor region P5. Namely, the p-type semiconductor region P3 is put in a state of being interposed between the p-type semiconductor region P5 and the n-type substrate region N1. Since the peripheries of the p-type semiconductor regions P3 and P5 are surrounded by the p-type semiconductor region P1 as viewed on a planar basis, the side surfaces of the p-type semiconductor regions P3 and P5 are in contact with the p-type semiconductor region P1. When the p-type semiconductor region P5 is set to an impurity concentration higher than that of the p-type semiconductor region P1, the p-type semiconductor region P1 at the portion that contacts the back surface of the semiconductor substrate 1 can be replaced with the p-type semiconductor region P5.

The p-type semiconductor region P5 is higher than the p-type semiconductor region P3 in impurity concentration (p-type impurity concentration). The p-type semiconductor region P3 is lower than the p-type semiconductor region P5 in impurity concentration (p-type impurity concentration). Therefore, the p-type semiconductor region P5 can be assumed to be a high-concentration p-type semiconductor region or a high-concentration p-type impurity diffusion region, whereas the p-type semiconductor region P3 can be assumed to be a low-concentration p-type semiconductor region or a low-concentration p-type impurity diffusion region. Since the p-type semiconductor region P5 is higher than the p-type semiconductor region P3 in impurity concentration, the specific resistivity (specific resistance) of the p-type semiconductor region P5 is lower than that of the p-type semiconductor region P3. The p-type semiconductor region P1 is higher than the p-type semiconductor regions P2 and P3 in impurity concentration (p-type impurity concentration), the p-type semiconductor region P1 can be assumed to be a high-concentration p-type semiconductor region or a high-concentration p-type impurity diffusion region.

While the n-type semiconductor region N4 is formed on the back surface side of the semiconductor substrate 1, it is formed within the p-type semiconductor region P5 and formed so as to be wrapped up with the p-type semiconductor region P5. Namely, the n-type semiconductor region N4 is formed so as to be internally included in the p-type semiconductor region P5. If another way of viewing is taken, the side surface and bottom surface (bottom) of the n-type semiconductor region N4 are in contact with the p-type semiconductor region P5, and the upper surface of the n-type semiconductor region N4 is exposed at the back surface of the semiconductor substrate 1. Therefore, the n-type semiconductor region N4 is neither in contact with the p-type semiconductor region P3 nor in contact with the n-type substrate region N1. The p-type semiconductor region P5 is put in a state of being interposed between the n-type semiconductor region N4 and the p-type semiconductor region P3.

The n-type semiconductor region N4 is formed shallower than the p-type semiconductor region P5. Namely, the depth (distance) from the back surface of the semiconductor substrate 1 to the bottom (bottom surface) of the n-type semiconductor region N4 is shallower (smaller) than the depth (distance) from the back surface of the semiconductor substrate 1 to the bottom (bottom surface) of the p-type semiconductor region P5. For instance, the n-type semiconductor region N4 is formed over a depth of about 2 μm to about 20 μm from the back surface of the semiconductor substrate 1. Since the n-type semiconductor region N4 and the p-type semiconductor region P5 are formed on the back surface side of the semiconductor substrate 1 herein, the back surface side of the semiconductor substrate 1 is called the upper surface and the inner side of the semiconductor substrate 1 is called the bottom surface (bottom) at the n-type semiconductor region N4 and the p-type semiconductor region P5.

The n-type semiconductor region N2, the n-type semiconductor region N3, the n-type semiconductor region N4 and the n-type semiconductor region N5 are higher than the n-type substrate region N1 in impurity concentration (n-type impurity concentration). Therefore, the specific resistivity (specific resistance) of each of the n-type semiconductor regions N2, N3, N4 and N5 is lower than that of the n-type substrate region N1. Each of the n-type semiconductor regions N2, N3, N4 and N5 can be assumed to be a high-concentration n-type semiconductor region or a high-concentration n-type impurity diffusion region, and the n-type substrate region N1 can be assumed to be a low-concentration n-type semiconductor region or a low-concentration n-type impurity diffusion region. The impurity concentrations (n-type impurity concentrations) of the n-type semiconductor regions N2, N3, N4 and N5 can be made nearly equal to each other.

The thickness (the thickness of the semiconductor substrate 1 approximately corresponds to that of a semiconductor substrate 1W to be describe later) of the semiconductor substrate 1 can be set to, for example, about 150 μm to about 300 μm. The distance (i.e., the thickness of the n-type substrate region N1 at a portion located between the p-type semiconductor region P2 and the p-type semiconductor region P3) from the bottom (bottom surface) of the p-type semiconductor region P2 to the upper surface of the p-type semiconductor region P3 can be set to, for example, about 50 μm to about 260 μm. Here, the bottom (bottom surface) of the p-type semiconductor region P2 corresponds to a PN junction surface formed between the p-type semiconductor region P2 and the n-type substrate region N1, whereas the upper surface of the p-type semiconductor region P3 corresponds to a PN junction surface formed between the p-type semiconductor region P3 and the n-type substrate region N1.

A relationship of contact among the n-type substrate region N1, the n-type semiconductor regions N2, N3, N4 and N5 and the p-type semiconductor regions P1, P2, P3, P4 and P5 that configure such a semiconductor substrate 1 will be explained more specifically as follows:

The p-type semiconductor region P1 is in contact with the n-type substrate region N1 and the p-type semiconductor regions P3 and P5, but not in contact with other semiconductor regions (N2, N3, N4, N5, P2 and P4). The p-type semiconductor region P2 is in contact with the n-type substrate region N1 and the p-type semiconductor region P4, but not in contact with other semiconductor regions (N2, N3, N4, N5, P1, P3 and P5). The p-type semiconductor region P3 is in contact with the n-type substrate region N1 and the p-type semiconductor regions P1 and P5, but not in contact with other semiconductor regions (N2, N3, N4, N5, P2 and P4). The p-type semiconductor region P4 is in contact with the n-type substrate regions N2 and N3 and the p-type semiconductor region P2, but not in contact with other semiconductor regions (N1, N4, N5, P1, P3 and P5). The p-type semiconductor region P5 is in contact with the n-type semiconductor region N4 and the p-type semiconductor regions P1 and P3, but not in contact with other semiconductor regions (N1, N2, N3, N5, P2 and P4). The n-type substrate region N1 is in contact with the n-type semiconductor region N5 and the p-type semiconductor regions P1, P2 and P3, but not in contact with other semiconductor regions (N2, N3, N4, P4 and P5). The n-type semiconductor region N2 is in contact with the p-type semiconductor region P4, but not in contact with other semiconductor regions (N1, N3, N4, N5, P1, P2, P3 and P5). The n-type semiconductor region N3 is in contact with the p-type semiconductor region P4, but not in contact with other semiconductor regions (N1, N2, N4, N5, P1, P2, P3 and P5). The n-type semiconductor region N4 is in contact with the p-type semiconductor region P5, but not in contact with other semiconductor regions (N1, N2, N3, N5, P1, P2, P3 and P4). The n-type semiconductor region N5 is in contact with the n-type substrate regions N1, but not in contact with other semiconductor regions (N2, N3, N4, P1, P2, P3, P4 and P5). The semiconductor substrate 1 is configured by these semiconductor regions (N1, N2, N3, N4, N5, P1, P2, P3, P4 and P5).

A back surface electrode (third electrode) BE is formed at the back surface (more specifically the entire back surface) of the semiconductor substrate 1 that configures the semiconductor device CP1 of the present embodiment. The back surface electrode BE is in contact with both the p-type semiconductor region P5 and the n-type semiconductor region N4 and electrically coupled to both the p-type semiconductor region P5 and the n-type semiconductor region N4. The back surface electrode BE is comprised of, for example, a metal film such as an Au (gold) film. The back surface electrode BE may be in contact with the p-type semiconductor region P1. The back surface electrode is however not in contact with other semiconductor regions (N1, N2, N3, N5, P2, P3 and P4).

An insulting film (interlayer insulating film) IL is formed at the surface (major surface on the side opposite to the side at which the back surface electrode BE is formed) of the semiconductor substrate 1 that configures the semiconductor device CP1 of the present embodiment. The insulating film IL is comprised of, for example, a PSG (Phospho Silicate Glass) film or the like. A plurality of contact holes (openings and through holes) CT are defined in the insulating film IL. Part of the major surface (front surface) of the semiconductor substrate 1 is exposed at the bottoms of the contact holes CT.

The contact holes CT formed in the insulating film IL have contact holes CT1, CT2 and CT3. Of these, the contact hole CT1 is formed to straddle both of the n-type semiconductor region N2 and the p-type semiconductor region P4. At least part of the n-type semiconductor region N2 and part of the p-type semiconductor region P4 are exposed at the bottom of the contact hole CT1. The contact hole CT2 is formed to straddle both of the n-type semiconductor region N3 and the p-type semiconductor region P4. At least part of the n-type semiconductor region N3 and part of the p-type semiconductor region P4 are exposed at the bottom of the contact hole CT2. Incidentally, since the contact hole CT1 and the contact hole CT2 do not overlap on a planar basis, the region exposed at the bottom of the contact hole CT1, of the p-type semiconductor region P4, and the region thereof exposed at the bottom of the contact hole CT2 do not overlap on a planar basis. The contact hole CT3 is formed over the n-type semiconductor region N5. Part of the n-type semiconductor region N5 is exposed at the bottom of the contact hole CT3.

An electrode (first electrode) E1, an electrode (second electrode) E2 and an electrode E3 are formed over the surface (first major surface) of the semiconductor substrate 1. Namely, the electrode E1 is formed above the n-type semiconductor region N2 and p-type semiconductor region P4 exposed at the bottom of the contact hole CT1. The electrode E2 is formed above the n-type semiconductor region N3 and p-type semiconductor region P4 exposed at the bottom of the contact hole CT2. The electrode E3 is formed above the n-type semiconductor region N5 exposed at the bottom of the contact hole CT3. Therefore, the electrode E1 is electrically coupled in contact with both the n-type semiconductor region N2 and the p-type semiconductor region P4. The electrode E2 is electrically coupled in contact with both the n-type semiconductor region N3 and the p-type semiconductor region P4. The electrode E3 is electrically coupled in contact with the n-type semiconductor region N5. As viewed on a planar basis, the electrode E1 internally includes the contact hole CT1, the electrode E2 internally includes the contact hole CT2, and the electrode E3 internally includes the contact hole CT3. Of the electrodes E1, E2 and E3, the portions thereof located outside the contact holes CT are located over the insulating film IL as viewed on a planar basis.

A relationship of contact between the electrodes E1, E2 and E3 will specifically be explained as follows: The electrode E1 is in contact with the n-type semiconductor region N2 and the p-type semiconductor region P4, but not in contact with other semiconductor regions (N1, N3, N4, N5, P1, P2, P3 and P5) and the electrodes E2 and E3. The electrode E2 is in contact with the n-type semiconductor region N3 and the p-type semiconductor region P4, but not in contact with other semiconductor regions (N1, N2, N4, N5, P1, P2, P3 and P5) and the electrodes E1 and E3. The electrode E3 is in contact with the n-type semiconductor region N5, but not in contact with other semiconductor regions (N1, N2, N3, N4, P1, P2, P3, P4 and P5) and the electrodes E1 and E2. The electrodes E1, E2 and E3 are not in contact with one another.

The electrodes E1, E2 and E3 are formed by a conductor film of the same layer, e.g., a conductor film comprised principally of aluminum. Each of the electrodes E1, E2 and E3 is formed by forming the conductor film over the insulating film IL to fill in the contact hole CT and then patterning the conductor film.

An insulating film PV is formed over the top layer on the front surface side of the semiconductor substrate 1, i.e., insulating film IL as a surface protective film (passivation film). The electrodes E1, E2 and E3 are formed by the conductor film of the same layer, but separated from one another. The passivation film PV is filled in between the electrodes E1, E2 and E3. The passivation film PV may serve as a resin material film (resin film) such as a polyimide film.

A plurality of openings (contact holes, via holes) OP are formed in the passivation film PV. The openings OP defined in the passivation film PV have openings OP1 and OP2. Of these, the opening OP1 is formed above the electrode E1. Part of the electrode E1 is exposed at the bottom of the opening OP1. Namely, the peripheral portion of the upper surface of the electrode E1 and its side surface are covered with the passivation film PV, and the central portion of the upper surface of the electrode E1 is exposed from the opening OP1. The opening OP2 is formed above the electrode E2. Part of the electrode E2 is exposed at the bottom of the opening OP2. Namely, the peripheral portion of the upper surface of the electrode E2 and its side surface are covered with the passivation film PV, and the central portion of the upper surface of the electrode E2 is exposed from the opening OP2. On the other hand, the electrode E3 is covered with the passivation film PV and is not exposed. The electrode E3 has a pattern shape approximately similar to the n-type semiconductor region N5 on a planar basis. The electrode E3 is configured as, for example, a ring-shaped pattern which surrounds the electrodes E1 and E2. Therefore, the electrode E3 can also be assumed to be a wiring.

The electrode E1 corresponding to the portion exposed from the opening OP1 and the electrode E2 corresponding to the portion exposed from the opening OP2 serve bonding pads (pads or pad electrodes), and coupling members such as bonding wires can be coupled thereto. Therefore, the electrodes E1 and E2 can also be assumed to be terminals. Bump electrodes (protruded electrodes) can also be formed over the electrodes E1 and E2 exposed from the openings OP1 and OP2 as other forms.

The semiconductor device of the present embodiment is obtained by cutting (dicing) a semiconductor substrate (semiconductor wafer) 1W into a plurality of chips as will be described later. It is therefore not necessary to form the insulating films IL and PV in the peripheral portion (near-side surface region of the surface of the semiconductor substrate 1) of the front surface of the semiconductor substrate 1 that configures the semiconductor device CP1 of the present embodiment. It is thus possible to facilitate the cutting (dicing) of the semiconductor substrate 1W.

<Manufacturing Method of Semiconductor Device>

A process for manufacturing the semiconductor device according to the present embodiment will next be explained with reference to the accompanying drawings.

FIGS. 4 through 13 are respectively sectional views in the manufacturing process of the semiconductor device CP1 of the present embodiment, or a semiconductor device CP1 having a triac herein, and show sections each corresponding to FIG. 2.

Figure 4:
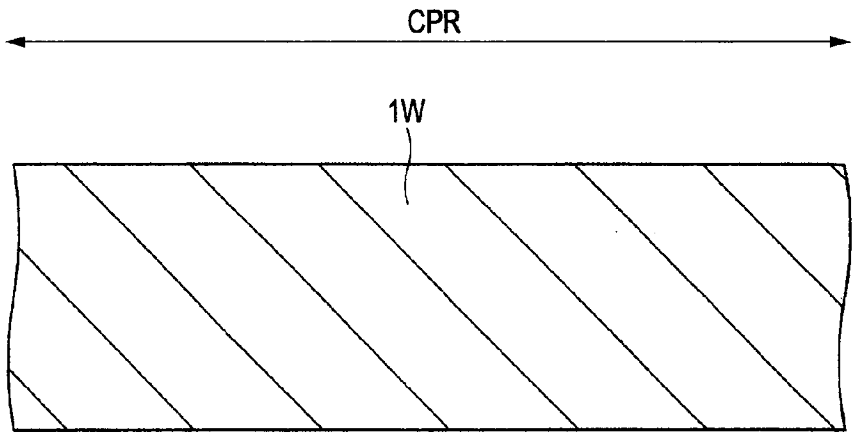
FIG. 4 is a fragmentary sectional view in a manufacturing process of a semiconductor device showing one embodiment of the present invention.

As shown in FIG. 4, a semiconductor substrate (semiconductor wafer) 1W comprised of n-type monocrystalline silicon or the like having a specific resistivity ranging from about 10 Ωcm to about 100 Ωcm, for example is first prepared.

Figure 5:
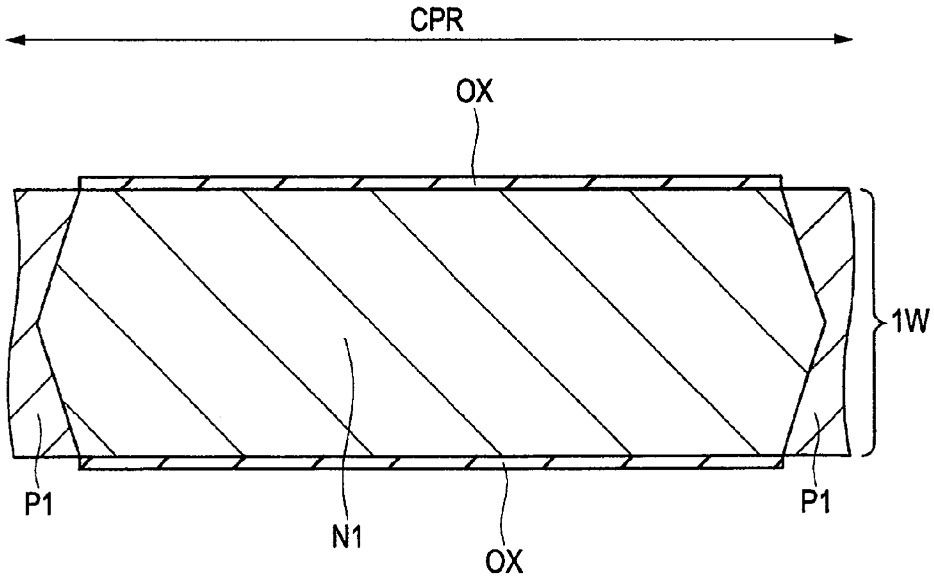
FIG. 5 is a fragmentary sectional view in the manufacturing process of the semiconductor device, following FIG. 4.

Next, as shown in FIG. 5, the front surface and back surface of the semiconductor substrate 1W are oxidized to form a silicon oxide film (insulating film) OX. Now, of two major surfaces of the semiconductor substrate 1W, which are located on the sides opposite to each other, the major surface (first, major surface) lying on the side at which electrodes E1 and E2 are formed later, is referred to as the front surface of the semiconductor substrate 1W, and the major surface (second major surface) lying on the side at which a back surface electrode BE is formed later, is referred to as the back surface of the semiconductor substrate 1W.

Next, the silicon oxide film OX lying at an outer peripheral portion of a chip region CPR is removed from the front and back surfaces of the semiconductor substrate 1W by using photolithography and etching methods. Then, a p-type impurity such as boron (B) is diffused in the direction of inside of the semiconductor substrate 1W from the front and back surfaces of the semiconductor substrate 1W as a dopant to thereby form p-type semiconductor regions P1 as shown in FIG. 5. Here, the chip region CPR corresponds to a region in which one semiconductor device (semiconductor chip) CP1 is manufactured therefrom. The p-type semiconductor regions P1 are preferably formed before other semiconductor regions (N2, N3, N4, N5, P2, P3, P4 and P5) are formed.

The diffusion of the p-type impurity for forming the corresponding p-type semiconductor regions P1 can be performed as follows: Solid, liquid or gas containing a p-type impurity like boron (B), for example is caused to contact the front and back surfaces of the semiconductor substrate 1W to apply a dopant source to the front and back surfaces of the semiconductor substrate 1W. Then the dopant (p-type impurity) is thermally diffused into the semiconductor substrate 1W from the front and back surfaces of the semiconductor substrate 1W. As a condition for the thermal diffusion of the p-type impurity (dopant) for forming the p-type semiconductor regions P1, for example, heat treatment at 1250 to 1300° C. for about 100 to 200 hours can be illustrated by way of example. Since the silicon oxide film OX functions as a mask (diffusion mask) at this time, the p-type impurity is diffused toward the inside of the semiconductor substrate 1W from the non-formed regions of silicon oxide film OX, of the front and back surfaces of the semiconductor substrate 1W. The p-type impurity is not however diffused toward the inside of the semiconductor substrate 1W from the formed regions of silicon oxide film OX, of the front and back surfaces of the semiconductor substrate 1W. Therefore, as shown in FIG. 5, the p-type semiconductor regions P1 are formed at the outer peripheral portion (outer peripheral region) of the chip region CPR. The p-type semiconductor region P1 formed by diffusing the p-type impurity from the front surface side of the semiconductor substrate 1W, and the p-type semiconductor region P1 formed by diffusing the p-type impurity from the back surface side of the semiconductor substrate 1W are coupled in the neighborhood of the center of the semiconductor substrate 1W as viewed in its thickness direction. Therefore, the so-coupled p-type semiconductor region P1 reaches from the front surface of the semiconductor substrate 1W to the back surface thereof.

Since the p-type semiconductor region P1 is formed at the outer peripheral portion of the chip region CPR as viewed on a planar basis, an n-type substrate region (n-type semiconductor region) N1 whose periphery is surrounded by the p-type semiconductor region P1 is defined in the chip region CPR as viewed on a planar basis. At this stage, the n-type substrate region N1 reaches from the front surface of the semiconductor substrate 1W to the back surface thereof. The n-type substrate region N1 corresponds to a region in which after the n-type semiconductor substrate 1W has been prepared as described above, the state of the impurity of the n-type semiconductor substrate 1W is maintained as it is with the impurity being almost undiffused. Therefore, the n-type substrate region N1 can also be assumed to be an n-type semiconductor region. After the formation of each p-type semiconductor region P1, other semiconductor regions (P2, P3, P4, P5, N2, N3, N4 and N5) are formed in the region (n-type substrate region N1) surrounded by the p-type semiconductor region P1 in each chip region CPR of the semiconductor substrate 1W as will be described below.

Figure 6:
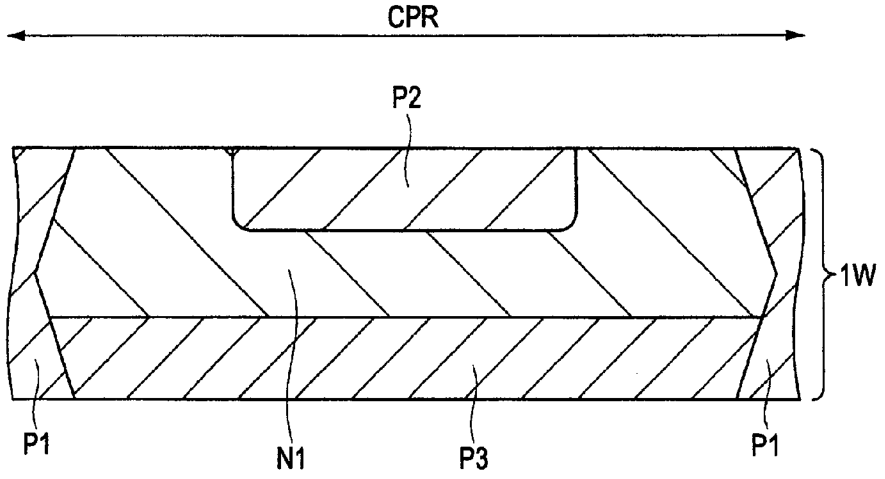
FIG. 6 is a fragmentary sectional view in the manufacturing process of the semiconductor device, following FIG. 5.

Next, as shown in FIG. 6, an impurity (p-type impurity) for the p-type semiconductor region P2 is diffused into the semiconductor substrate 1W from the front surface side of the semiconductor substrate 1W to form the p-type semiconductor region P2 on the front surface side of the semiconductor substrate 1W. An impurity (p-type impurity) for the p-type semiconductor region P3 is diffused into the semiconductor substrate 1W from the back surface side of the semiconductor substrate 1W to form the p-type semiconductor region P3 on the back surface side of the semiconductor substrate 1W. Specifically, the p-type semiconductor regions P2 and P3 can be formed as follows:

First, ion implantation for the p-type semiconductor region P2 is performed from the front surface side of the semiconductor substrate 1W to introduce an impurity (p-type impurity) for the p-type semiconductor region P2 into the neighborhood (surface layer portion on the front surface side) of the front surface of the semiconductor substrate 1W. Further, ion implantation for the p-type semiconductor region P3 is performed from the back surface side of the semiconductor substrate 1W to introduce an impurity (p-type impurity) for the p-type semiconductor region P3 into the neighborhood (surface layer portion on the back surface side) of the back surface of the semiconductor substrate 1W. Then, the p-type impurity (e.g., boron or the like) introduced by each of the ion implantation for the p-type semiconductor region P2 and the ion implantation for the p-type semiconductor region P3 is further diffused into the semiconductor substrate 1W (principally diffused in the direction of thickness of the semiconductor substrate 1W) by heat treatment to thereby form the corresponding p-type semiconductor regions P2 and P3. As a condition for thermal diffusion of the p-type impurity (e.g., boron or the like) for forming the p-type semiconductor regions P2 and P3, for example, heat treatment at 1250 to 1300° C. for about 25 to 50 hours can be illustrated by way of example. Since the thermal diffusion process for forming the p-type semiconductor region P2 and the thermal diffusion process for forming the p-type semiconductor region P3 are performed by the same heat treatment, the number of manufacturing process steps can be reduced.

The p-type semiconductor region P2 is formed over a depth of about 20 to 50 μm from the front surface of the semiconductor substrate 1W. By using a photoresist pattern formed by the photolithography method as an ion implantation blocking mask when the ion implantation for the p-type semiconductor region P2 is performed, etc., the p-type semiconductor region P2 is formed to be away from the p-type semiconductor region P1 as viewed on a planar basis and formed to be spaced apart from the end (outer peripheral portion) of the chip region CPR by about 400 to 1000 μm.

On the other hand, the p-type semiconductor region P3 is formed over a depth of about 20 to 50 μm from the back surface of the semiconductor substrate 1W. The side surface of the p-type semiconductor region P3 is placed in a state of being in contact with the p-type semiconductor region P1. Since the thermal diffusion process for the formation of the p-type semiconductor region P2 and the thermal diffusion process for the formation of the p-type semiconductor region P3 are performed by the same heat treatment, the depth from the front surface of the semiconductor substrate 1W to the bottom surface (bottom) of the p-type semiconductor region P2, and the depth from the back surface of the semiconductor substrate 1W to the bottom surface (bottom) of the p-type semiconductor region P3 become approximately the same.

Figure 7:
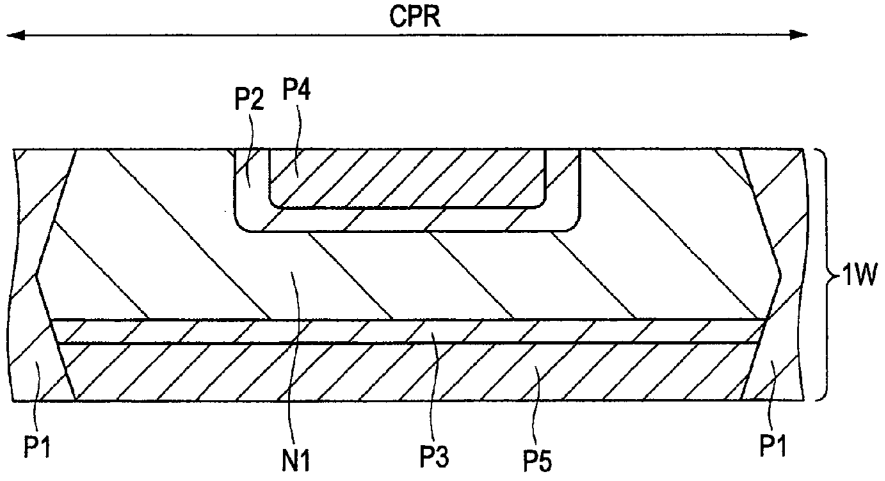
FIG. 7 is a fragmentary sectional view in the manufacturing process of the semiconductor device, following FIG. 6.

Next, as shown in FIG. 7, an impurity (p-type impurity) for the p-type semiconductor region P4 is diffused into the semiconductor substrate 1W from the front surface side of the semiconductor substrate 1W to form the p-type semiconductor region P4 on the front surface side of the semiconductor substrate 1W. An impurity (p-type impurity) for the p-type semiconductor region P5 is diffused into the semiconductor substrate 1W from the back surface side of the semiconductor substrate 1W to form the p-type semiconductor region P5 on the back surface side of the semiconductor substrate 1W. The formed p-type semiconductor region P4 is higher than the p-type semiconductor region P2 in impurity concentration. The formed p-type semiconductor region P5 is higher than the p-type semiconductor region P3 in impurity concentration. Specifically, the p-type semiconductor regions P4 and P5 can be formed as follows:

First, ion implantation for the p-type semiconductor region P4 is performed from the front surface side of the semiconductor substrate 1W to introduce the impurity (p-type impurity) for the p-type semiconductor region P4 into the neighborhood (surface layer portion on the front surface side) of the front surface of the semiconductor substrate 1W. Ion implantation for the p-type semiconductor region P5 is performed from the back surface side of the semiconductor substrate 1W to introduce the impurity (p-type impurity) for the p-type semiconductor region P5 into the neighborhood (surface layer portion on the back surface side) of the back surface of the semiconductor substrate 1W. Then, the p-type impurity (e.g., boron or the like) introduced by each of the ion implantation for the p-type semiconductor region P4 and the ion implantation for the p-type semiconductor region P5 is further diffused into the semiconductor substrate 1W (principally diffused in the direction of thickness of the semiconductor substrate 1W) by heat treatment to thereby form the corresponding p-type semiconductor regions P4 and P5. As a condition for thermal diffusion of the p-type impurity (e.g., boron or the like) for forming the p-type semiconductor regions P4 and P5, for example, heat treatment at 1100 to 1250° C. for about 10 to 30 hours can be illustrated by way of example. Since the thermal diffusion process for forming the p-type semiconductor region P4 and the thermal diffusion process for forming the p-type semiconductor region P5 are performed by the same heat treatment, the number of manufacturing process steps can be reduced.

By using a photoresist pattern formed by the photolithography method as an ion implantation blocking mask when the ion implantation for the p-type semiconductor region P4 is performed, etc., the p-type semiconductor region P4 is formed to be internally included in the p-type semiconductor region P2 as seen on a planar basis. Further, the p-type semiconductor region P4 is formed shallower than the p-type semiconductor region P2 and formed over, for example, a depth of about 10 μm to about 30 μm from the front surface of the semiconductor substrate 1W. Therefore, the p-type semiconductor region P4 is formed within the p-type semiconductor region P2 and formed to be internally included in the p-type semiconductor region P2 even as viewed on a planar basis and in the thickness direction. Consequently, the p-type semiconductor region P4 is not in contact with the n-type substrate region N1, and the p-type semiconductor region P2 is placed in a state of being interposed between the p-type semiconductor region P4 and the n-type substrate region N1.

On the other hand, the p-type semiconductor region P5 is formed shallower than the p-type semiconductor region P3. The p-type semiconductor region P5 is formed over, for example, a depth of about 10 to 30 μm from the back surface of the semiconductor substrate 1W. Therefore, the p-type semiconductor region P5 is not in contact with the n-type substrate region N1, and the p-type semiconductor region P3 is put in a state of being interposed between the p-type semiconductor region P5 and the n-type substrate region N1. The side surface of the p-type semiconductor region P5 is placed in a state of being in contact with the p-type semiconductor region P1. Since the thermal diffusion process for the formation of the p-type semiconductor region P4 and the thermal diffusion process for the formation of the p-type semiconductor region P5 are performed by the same heat treatment, the depth from the front surface of the semiconductor substrate 1W to the bottom surface (bottom) of the p-type semiconductor region P4, and the depth from the back surface of the semiconductor substrate 1W to the bottom surface (bottom) of the p-type semiconductor region P5 become approximately the same.

Figure 8:
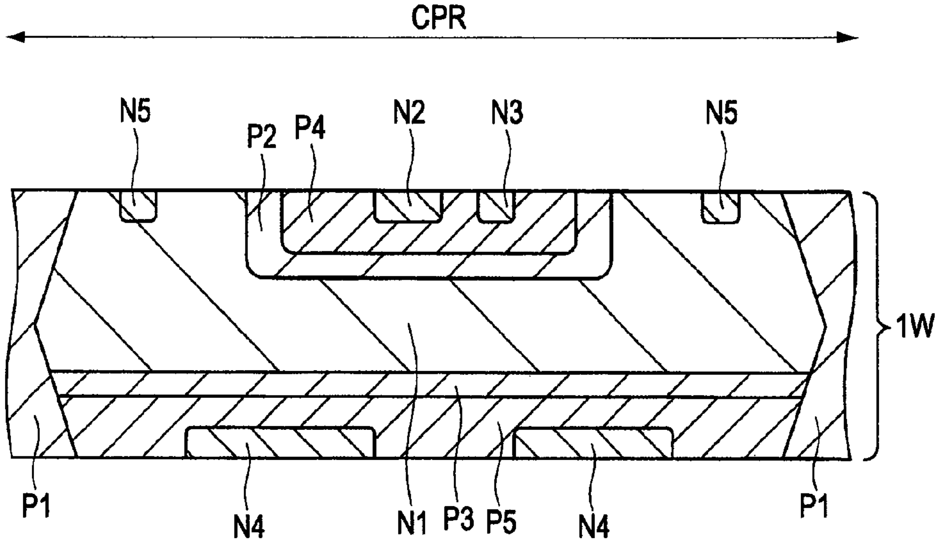
FIG. 8 is a fragmentary sectional view in the manufacturing process of the semiconductor device, following FIG. 7.

Next, as shown in FIG. 8, an impurity (n-type impurity) for the n-type semiconductor regions N2, N3 and N5 is diffused into the semiconductor substrate 1W from the front surface side of the semiconductor substrate 1W to form the n-type semiconductor regions N2, N3 and N5 on the front surface side of the semiconductor substrate 1W. An impurity (n-type impurity) for the n-type semiconductor region N4 is diffused into the semiconductor substrate 1W from the back surface side of the semiconductor substrate 1W to form the n-type semiconductor region N4 on the back surface side of the semiconductor substrate 1W. The formed n-type semiconductor regions N2, N3, N4 and N5 are higher than the n-type substrate region N1 in impurity concentration. Specifically, the n-type semiconductor regions N2, N3, N4 and N5 can be formed in the following manner.

The diffusion of the n-type impurity for forming the n-type semiconductor regions N2, N3, N4 and N5 can be performed in the following manner: Solid, liquid or gas containing an n-type impurity like phosphorus (P), for example is caused to contact the front and back surfaces of the semiconductor substrate 1W to apply a dopant source to the front and back surfaces of the semiconductor substrate 1W. Then, the dopant (n-type impurity) is thermally diffused into the semiconductor substrate 1W from the front and back surfaces of the semiconductor substrate 1W. By using photoresist patterns (formed in regions in which the n-type semiconductor regions N2, N3, N4 and N5 are not formed at the front and back surfaces of the semiconductor substrate 1W) formed using the photolithography method at this time, the dopant source may partly be applied to the front and back surfaces of the semiconductor substrate 1W. As a condition for the thermal diffusion of the n-type impurity for forming the n-type semiconductor regions N2, N3, N4 and N5, for example, heat treatment at 1000 to 1200° C. for about 1 to 20 hours can be illustrated by way of example. Since the thermal diffusion process for forming the n-type semiconductor region N2, the thermal diffusion process for forming the n-type semiconductor region N3, the thermal diffusion process for forming the n-type semiconductor region N4, and the thermal diffusion process for forming the n-type semiconductor region N5 are carried out by the same heat treatment, the number of manufacturing process steps can be reduced.

The n-type semiconductor region N2 and the n-type semiconductor region N3 are formed apart from each other as viewed on a planar basis. Since the n-type semiconductor region N2 and the n-type semiconductor region N3 are spaced apart from each other, part of the p-type semiconductor region P4 exists therebetween. Both of the n-type semiconductor region N2 and the n-type semiconductor region N3 are formed so as to be internally included in the p-type semiconductor region P4 as seen on a planar basis. The n-type semiconductor region N2 and the n-type semiconductor region N3 are formed shallower than the p-type semiconductor region P4 and formed over, for example, a depth of about 2 to 20 μm from the front surface of the semiconductor substrate 1W. Therefore, the n-type semiconductor regions N2 and N3 are formed within the p-type semiconductor region P4. The n-type semiconductor regions N2 and N3 are formed to be internally included in the p-type semiconductor region P4 even as viewed on a planar basis and in the thickness direction.

On the other hand, the n-type semiconductor region N5 is formed in part of the surface layer portion of the n-type substrate region N1. As shown in FIG. 1, for example, the n-type semiconductor region N5 is formed to a ring-like planar shape that surrounds the p-type semiconductor region P2, as seen on a planar basis. Further, the n-type semiconductor region N5 is formed apart from the p-type semiconductor regions P1 and P2 and between the p-type semiconductor region P2 and its corresponding p-type semiconductor region P1.

The n-type semiconductor region N4 is formed to be internally included in the p-type semiconductor region P5 as seen on a planar basis. Further, the n-type semiconductor region N4 is formed shallower than the p-type semiconductor region P5 and formed over, for example, a depth of about 2 μm to about 20 μm from the back surface of the semiconductor substrate 1W. Therefore, the n-type semiconductor region N4 is formed within the p-type semiconductor region P5 and formed to be internally included in the p-type semiconductor region P5 even as viewed on a planar basis and in the thickness direction. Since the thermal diffusion processes for the formation of the n-type semiconductor regions N2, N3, N4 and N5 are performed by the same heat treatment, the respective depths from the front surface of the semiconductor substrate 1 to the respective bottom surfaces (bottoms) of the n-type semiconductor regions N2, N3 and N5, and the depth from the back surface of the semiconductor substrate 1 to the bottom surface (bottom) of the n-type semiconductor region N4 become approximately the same.

Figure 9:
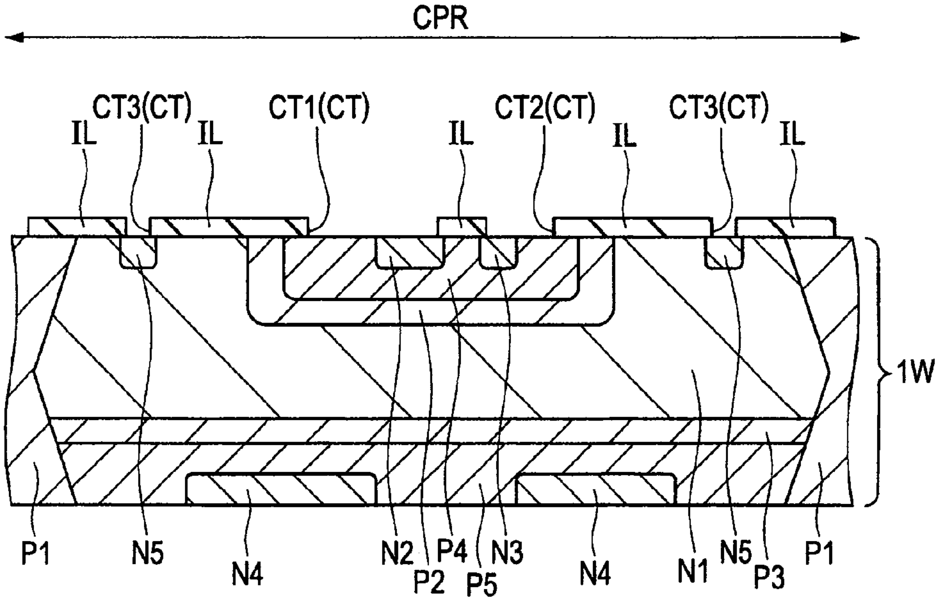
FIG. 9 is a fragmentary sectional view in the manufacturing process of the semiconductor device, following FIG. 8.

Next, as shown in FIG. 9, an insulating film (interlayer insulating film) IL is formed over the entire major surface of the semiconductor substrate 1W on the front surface side thereof. The insulating film IL can serve as, for example, a PSG (Phospho Silicate Glass) film or the like. Then, a plurality of contact holes CT (i.e., contact holes CT1, CT2 and CT3) are defined in the insulating film IL by using, for example, the photolithography method and the etching method or the like. There are shown in FIG. 9, steps at which the contact holes CT are formed. Part of the major surface (surface) of the semiconductor substrate 1W is exposed at the bottoms of the contact holes CT of the insulating film IL. Specifically, at least part of the n-type semiconductor region N2 and part of the p-type semiconductor region P4 are exposed at the bottom of the contact hole CT1. At least part of the n-type semiconductor region N3 and part of the p-type semiconductor region P4 are exposed at the bottom of the contact hole CT2. Part of the n-type semiconductor region N5 is exposed at the bottom of the contact hole CT3.

Figure 10:
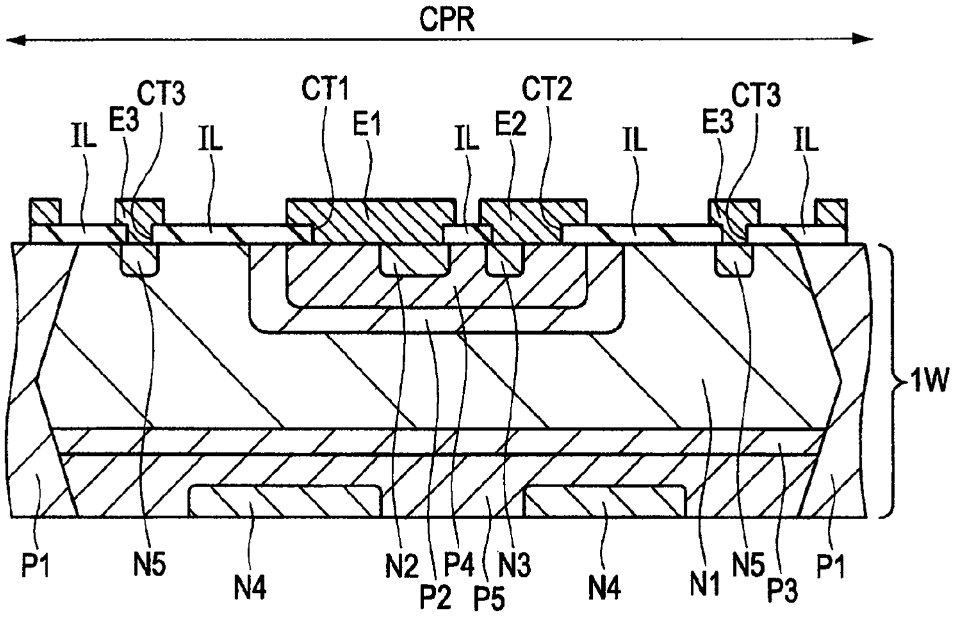
FIG. 10 is a fragmentary sectional view in the manufacturing process of the semiconductor device, following FIG. 9.

Next, as shown in FIG. 10, electrodes E1, E2 and E3 are formed by forming a conductor film over the entire major surface of the semiconductor substrate 1W on its front surface side and then patterning the conductor film using, for example, the photolithography method and the etching method or the like. The conductor film for the formation of the electrodes E1, E2 and E3 can serve as a conductor film comprised principally of aluminum, for example and can be formed by a PVD method or the like. The electrode E1 is electrically coupled to the n-type semiconductor region N2 and the p-type semiconductor region P4 in contact therewith at the bottom of the contact hole CT1. The electrode E2 is electrically coupled to the n-type semiconductor region N3 and the p-type semiconductor region P4 in contact therewith at the bottom of the contact hole CT2. The electrode E3 is electrically coupled to the n-type semiconductor region N5 in contact therewith at the bottom of the contact hole CT3.

Figure 11:
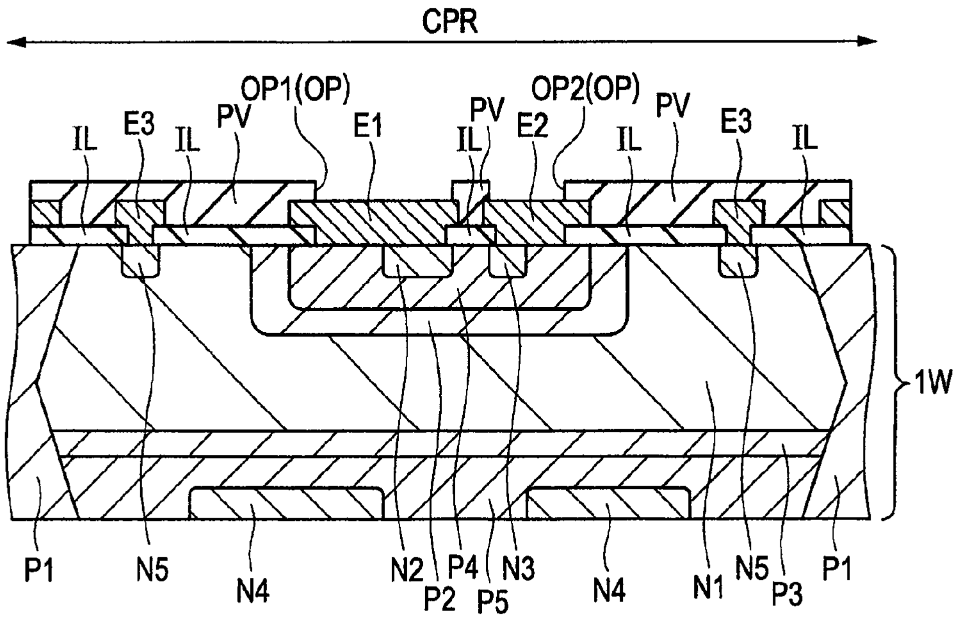
FIG. 11 is a fragmentary sectional view in the manufacturing process of the semiconductor device, following FIG. 10.

Next, as shown in FIG. 11, an insulating film PV is formed over the entire major surface of the semiconductor substrate 1W on the front surface side thereof as a surface protective film (passivation film). That is, the passivation film PV is formed over the insulating film IL so as to cover the electrodes E1, E2 and E3. The passivation film PV may serve as a resin material film (resin film) such as a polyimide resin. Thus, the electrodes E1, E2 and E3 are covered with the passivation film PV used as the surface protective film. The passivation film PV serves as a film for the top layer of the semiconductor device CP1 and functions as a top layer protective film for protecting the semiconductor device CP1. Allowing the passivation film PV of the top layer to serve as a resin film (organic insulating film) like the polyimide resin or the like makes it possible to facilitate handling of the semiconductor device CP1 with the relatively soft resin film as the top layer.

Next, a plurality of openings OP (or openings OP1 and OP2) are formed in the passivation film PV using, for example, the photolithography method and the etching method or the like. There are shown in FIG. 11, steps at which the openings OP are formed. Parts of the electrodes E1 and E2 are exposed at the bottoms of the openings OP of the passivation film PV. Specifically, part of the electrode E1 is exposed from the opening OP1, and part of the electrode E2 is exposed from the opening OP2.

Figure 12:
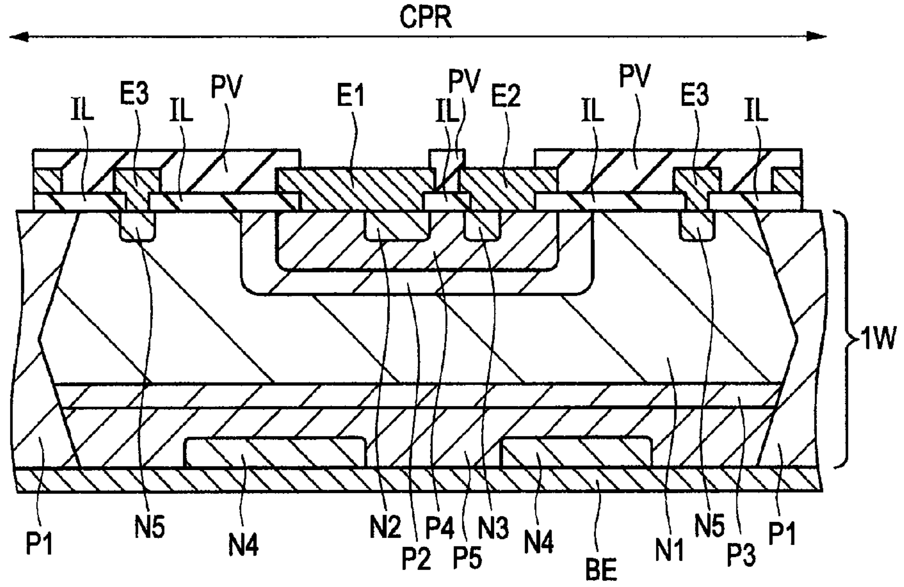
FIG. 12 is a fragmentary sectional view in the manufacturing process of the semiconductor device, following FIG. 11.

Next, as shown in FIG. 12, a back surface electrode BE is formed over the entire major surface of the semiconductor substrate 1W on its back surface side. The back surface electrode BE can be formed by, for example, the PVD method or the like. The back surface electrode BE is in contact with the n-type semiconductor region N4 and the p-type semiconductor regions P1 and P5.

Figure 13:
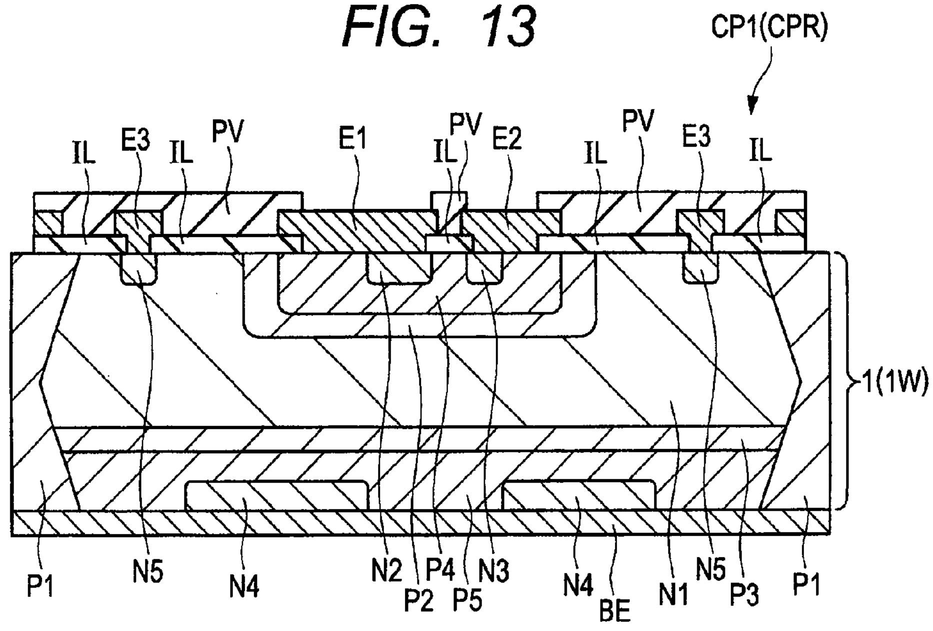
FIG. 13 is a fragmentary sectional view in the manufacturing process of the semiconductor device, following FIG. 12.

Thereafter, as shown in FIG. 13, the semiconductor substrate 1W is separated into chip regions CPR by dicing. Each individualized chip region CPR serves as the semiconductor device (semiconductor chip) CP1 of the present embodiment. Therefore, the semiconductor substrate 1W corresponds to one prior to the dicing of the semiconductor substrate 1, and the semiconductor substrate 1 corresponds to each individualized one of the semiconductor substrate 1W.

<Description of Triac>

Figure 14:
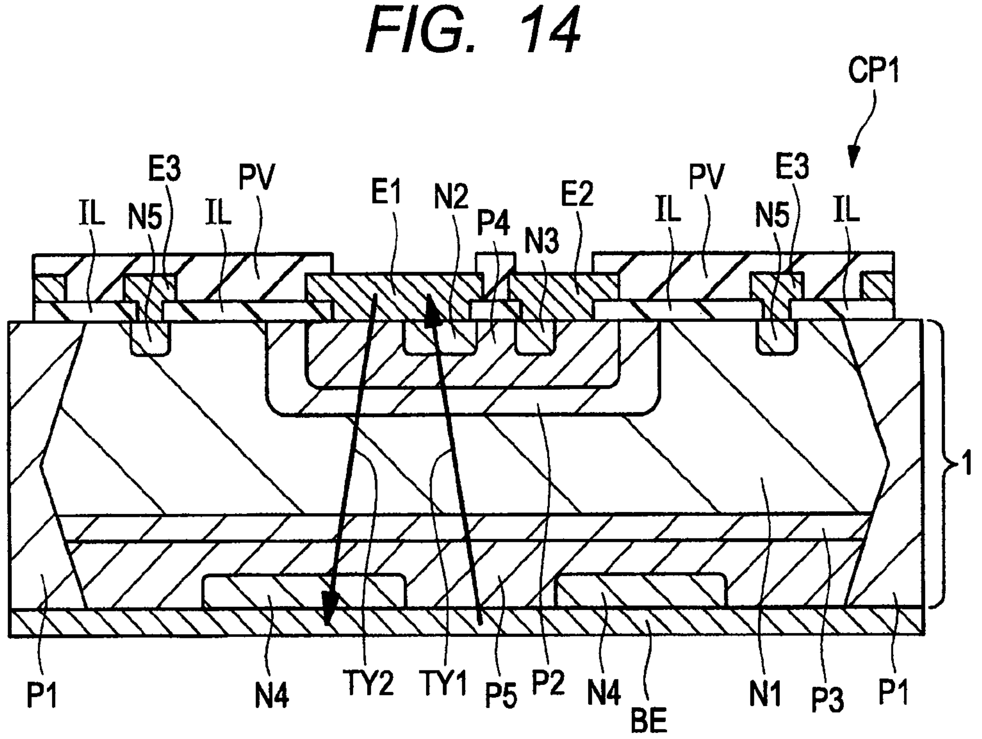
FIG. 14 is a diagram for explaining a triac formed in the semiconductor device shown in FIG. 1.

FIG. 14 is a diagram for describing a triac formed in the semiconductor device CP1 of the present embodiment and shows the same section as that shown in FIG. 2.

The semiconductor device CP1 of the present embodiment is of a semiconductor device formed with a triac, i.e., a semiconductor device formed with a bidirectional thyristor. Specifically, thyristors TY1 and TY2 are formed between the electrode E1 and the back surface electrode BE. Incidentally, currents that can flow through the thyristors TY1 and TY2 are typically shown by arrows in FIG. 14. The semiconductor device CP1 has a circuit configuration in which the thyristors TY1 and TY2 are coupled in parallel between the electrode E1 and the back surface electrode BE. At the thyristors TY1 and TY2, however, the currents flowing between the electrode E1 and the back surface electrode BE are opposite in direction.

The thyristor TY1 is formed between the back surface electrode BE and the electrode E1 by the p-type semiconductor regions P5 and P3, n-type substrate region N1, p-type semiconductor regions P2 and P4, and n-type semiconductor region N2. Namely, the thyristor TY1 is formed by coupling in series, p-type semiconductor regions (p-type semiconductor regions P5 and P3 herein), an n-type semiconductor region (n-type substrate region N1 herein), p-type semiconductor regions (p-type semiconductor regions P2 and P4 herein) and an n-type semiconductor region (n-type semiconductor region N2 herein) between the back surface electrode BE and the electrode E1 in order from the side of the back surface electrode BE.

The thyristor TY2 is formed between the electrode E1 and the back surface electrode BE by the p-type semiconductor regions P4 and P2, n-type substrate region N1, p-type semiconductor regions P3 and P5 and n-type semiconductor region N4. Namely, the thyristor TY2 is formed by coupling in series, p-type semiconductor regions (p-type semiconductor regions P4 and P2 herein), an n-type semiconductor region (n-type substrate region N1 herein), p-type semiconductor regions (p-type semiconductor regions P3 and P5 herein) and an n-type semiconductor region (n-type semiconductor region N4 herein) between the electrode E1 and the back surface electrode BE in order from the electrode E1 side.

In the thyristor TY1, the back surface electrode BE side serves as an anode side thereof, and the electrode E1 side serves as a cathode side thereof. On the other hand, in the thyristor TY2, the electrode E1 side serves as an anode side thereof, and the back surface electrode BE side serves as a cathode side thereof. The electrode E2 can function as a gate terminal (gate terminals of thyristors TY1 and TY2). The thyristor TY1 can also serve as a thyristor in which current flows from the back surface electrode BE to the electrode E1 via the p-type semiconductor region P5, p-type semiconductor region P3, n-type substrate region N1, p-type semiconductor region P2, p-type semiconductor region P4, and n-type semiconductor region N2. The thyristor TY2 can also serve as a thyristor in which current flows from the electrode E1 to the back surface electrode BE via the p-type semiconductor region P4, p-type semiconductor region P2, n-type substrate region N1, p-type semiconductor region P3, p-type semiconductor region P5 and n-type semiconductor region N4.

In order to bring the thyristor TY1 to an on state (conducting state or turn-on state), an on voltage (e.g., positive potential) higher in potential than at the electrode E1 is applied to the electrode E2 corresponding to the gate terminal in a state in which the back surface electrode BE is set to a potential higher than that at the electrode E1 (e.g., a state in which a positive potential is applied to the back surface electrode BE, and a negative potential is applied to the electrode E1, respectively). The potential of the electrode E2 is applied to the p-type semiconductor region P4. Thus, a transistor formed by the n-type semiconductor region N2, p-type semiconductor regions P4 and P2 and n-type substrate region N1 is first turned on. Then, a transistor formed by the p-type semiconductor regions P4 and P2, n-type substrate region N1 and p-type semiconductor regions P3 and P5 is turned on, thereby turning on the thyristor TY1. With the turning on of the thyristor TY1, the back surface electrode BE (anode herein) and the electrode E1 (cathode herein) are made conductive therebetween (turned on), so that current flows from the back surface electrode BE (anode herein) to the electrode E1 (cathode herein) via the p-type semiconductor region P5, p-type semiconductor region P3, n-type substrate region N1, p-type semiconductor region P2, p-type semiconductor region P4 and n-type semiconductor region N2. Namely, the current flows in the direction indicated by the arrow labeled with the symbol TY1 in FIG. 14.

Once the thyristor TY1 is brought to the on state, the on state of the thyristor TY1 is maintained even though the application of the on voltage (positive potential) to the electrode E2 (gate terminal) is stopped, so that the passage of the current from the back surface electrode BE to the electrode E1 (passage of current labeled with the symbol TY1 in FIG. 14) is continued. It is necessary for the current passing between the back surface electrode BE and the electrode E1 to be set to a predetermined current value or less to stop (turn off) the conduction of the thyristor TY1. Namely, once the thyristor TY1 is brought to the on state, the on state of the thyristor TY1 is continued while the current passing between the back surface electrode BE and the electrode E1 is larger than the predetermined current value, but when the current passing therebetween reaches the predetermined current value or less, the conduction of the thyristor TY1 is stopped (turned off).

In order to bring the thyristor TY2 to an on state (conducting state or turn-on state), an on voltage (e.g., negative potential) lower in potential than at the electrode E1 is applied to the electrode E2 corresponding to the gate terminal in a state in which the electrode E1 is set to a potential higher than that at the back surface electrode BE (e.g., a state in which a negative potential is applied to the back surface electrode BE, and a positive potential is applied to the electrode E1, respectively). The potential of the electrode E2 is applied to the n-type semiconductor region N3. Thus, a transistor formed by the n-type semiconductor region N3, p-type semiconductor regions P4 and P2 and n-type substrate region N1 is first turned on. Then, the transistor formed by the p-type semiconductor regions P4 and P2, n-type substrate region N1 and p-type semiconductor regions P3 and P5 is turned on. Subsequently, a transistor formed by the n-type substrate region N1, p-type semiconductor regions P3 and P5 and n-type semiconductor region N4 is turned on, thereby turning on the thyristor TY2. With the turning on of the thyristor TY2, the electrode E1 (anode herein) and the back surface electrode BE (cathode herein) are made conductive therebetween (turned on), so that current flows from the electrode E1 (anode herein) to the back surface electrode BE (cathode herein) through the p-type semiconductor region P4, p-type semiconductor region P2, n-type substrate region N1, p-type semiconductor region P3, p-type semiconductor region P5 and n-type semiconductor region N4. Namely, the current flows in the direction indicated by the arrow labeled with the symbol TY2 in FIG. 14.

Once the thyristor TY2 is brought to the on state, the on state of the thyristor TY2 is maintained even though the application of the on voltage (negative potential) to the electrode E2 (gate terminal) is stopped, so that the passage of the current from the electrode E1 to the back surface electrode BE (passage of current labeled with the symbol TY2 in FIG. 14) is continued. It is necessary for the current passing between the electrode E1 and the back surface electrode BE to be set to a predetermined current value or less to stop (turn off) the conduction of the thyristor TY2. Namely, once the thyristor TY2 is brought to the on state, the on state of the thyristor TY2 is continued while the current passing between the electrode E1 and the back surface electrode BE is greater than the predetermined current value, but when the current passing therebetween reaches the predetermined current value or less, the conduction of the thyristor TY2 is stopped (turned off).

Figure 15:
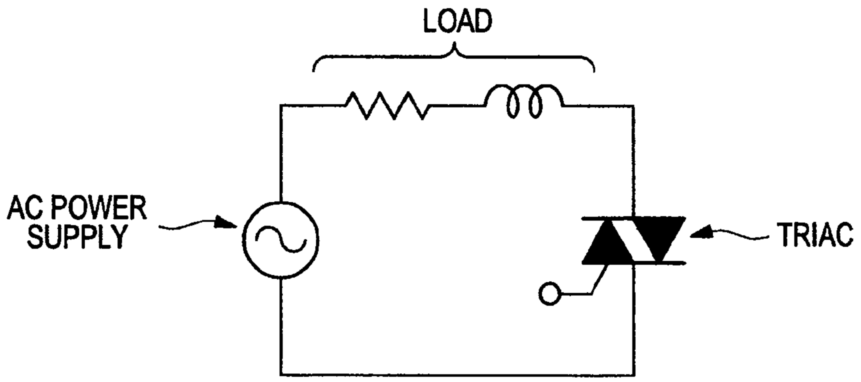
FIG. 15 is a circuit diagram showing a used example of the triac.

FIG. 15 is a circuit diagram showing a used example of the triac.

The triac can be used as a device for controlling an alternating current. As shown in FIG. 15, for example, the triac can be used under the coupling of a load LD and the triac in series with an ac power supply ACP. In the case of FIG. 15, one of two main terminals (those corresponding to the electrode E1 and the back surface electrode BE) of the triac is coupled to one terminal of the ac power supply ACP via the load LD, whereas the other thereof is coupled to the other terminal of the ac power supply ACP.

Figure 16:
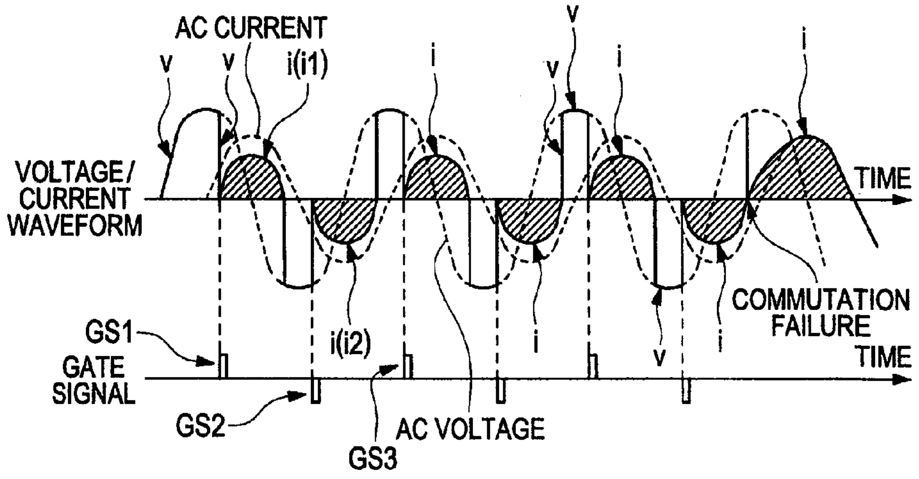
FIG. 16 is an explanatory diagram showing voltage/current waveforms and a gate signal applied to the triac.

FIG. 16 is an explanatory diagram showing voltage/current waveforms and a gate signal applied to the triac. An ac voltage indicated by a dotted line in FIG. 16 approximately corresponds to the waveform of an ac voltage of the ac power supply ACP. An ac current indicated by a dotted line in FIG. 16 shows the waveform of an ac current (virtual ac current) that can flow where no triac exists in the circuit of FIG. 15. The waveforms of these ac voltage and current have a difference in phase due to the load LD or the like. A voltage v indicated by a solid line in FIG. 16 corresponds to a voltage applied to the triac. A waveform indicated with hatching in FIG. 16 corresponds to a current i that has passed through the triac. The gate signal shown in FIG. 16 corresponds to a voltage signal applied to its corresponding gate terminal (electrode E2 herein) of the triac (semiconductor device CP1).

When a gate signal GS1 is applied to the gate terminal (one corresponding to the electrode E2) of the triac in FIG. 16, the triac (one of two thyristors corresponding to the above thyristors TY1 and TY2) is turned on so that a current i1 shown in FIG. 16 flows. Once the current i1 flows, the current i1 continues to flow even if the gate signal GS1 is turned off, but the triac is turned off at the stage where the current i1 reaches near zero. Thereafter, the triac maintains a non-conducting state until the next gate signal GS2 is applied to the gate terminal (one corresponding to the electrode E2) of the triac, and no current flows. Then, when the next gate signal GS2 is applied, the triac (the other of the two thyristors corresponding to the above thyristors TY1 and TY2) formed in the semiconductor device CP1 is turned on so that a current i2 (the direction in which the current i2 flows is opposite to the direction in which the current i1 flows) shown in FIG. 16 flows. Once the current i2 flows, the current i2 continues to flow even if the gate signal GS2 is turned off. The triac is turned off at the stage where the current i2 reaches near zero. Thereafter, the triac maintains a non-conducting state (off state) until the next gate signal GS3 is applied, and no current flows. This operation is repeated to perform ac control. Thus, the triac can be used as the device for controlling the ac. The triac is used by changing the direction in which current flowing from plus to minus directions to its opposite direction (minus to plus direction). This is referred to as "commutation".

Figure 17:
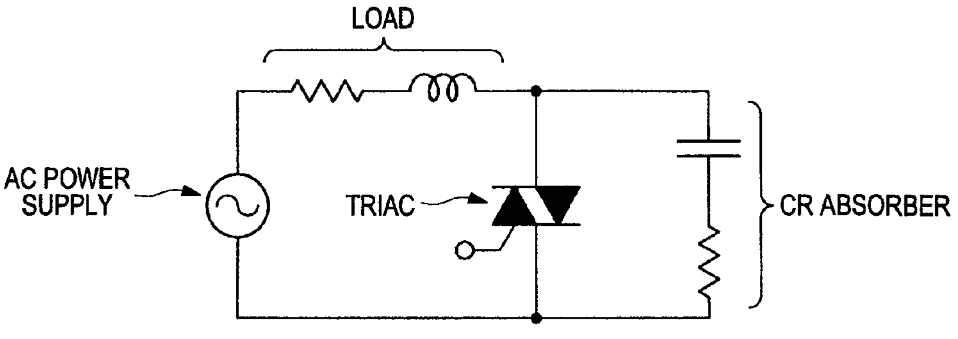
FIG. 17 is a circuit diagram showing another used example of a triac.

A failure in commutation is however occurring in FIG. 16. In FIG. 16, the triac goes into an on state (turn-on) without the application of a gate signal at a spot indicated as "the failure in commutation". This means the failure in commutation. The failure in commutation corresponds to the phenomenon that the triac is turned on unintentionally without the gate signal being input. This commutation failure is of a phenomenon which occurs when (di/dt)c indicative of the rate of change in current (time differential value of current) and (dv/dt)c indicative of the rate of change in voltage (time differential value of voltage) reaches a given value or more respectively. Controlling (dv/dt)c indicative of the rate of change in the voltage (time differential value of voltage) applied to the triac by coupling a CR absorber as in a circuit diagram shown in FIG. 17 is effective in preventing such a commutation failure. Now, FIG. 17 is a circuit diagram showing another used example of the triac.

The CR absorber is formed of a resistor and a capacitor coupled in series and is coupled in parallel to the triac. Since the CR absorber is however configured by the resistor and the capacitor, the use of the CR absorber results in an increase in the manufacturing cost and upsizing of an electronic apparatus. It is therefore desirable to make it hard to cause the commutation failure by devising the triac itself. It is also desired that the triac itself formed in the semiconductor device (semiconductor substrate) is devised because large current flows through the triac and the voltage to be applied thereto is also high, thereby achieving a triac's high breakdown voltage.

<Major Features>

Thus, the following contrivances have been performed in the present embodiment. The major features of the semiconductor device CP1 of the present embodiment will be explained below referring to semiconductor devices CP101, CP201 and CP301 according to comparative examples.

Figure 18:
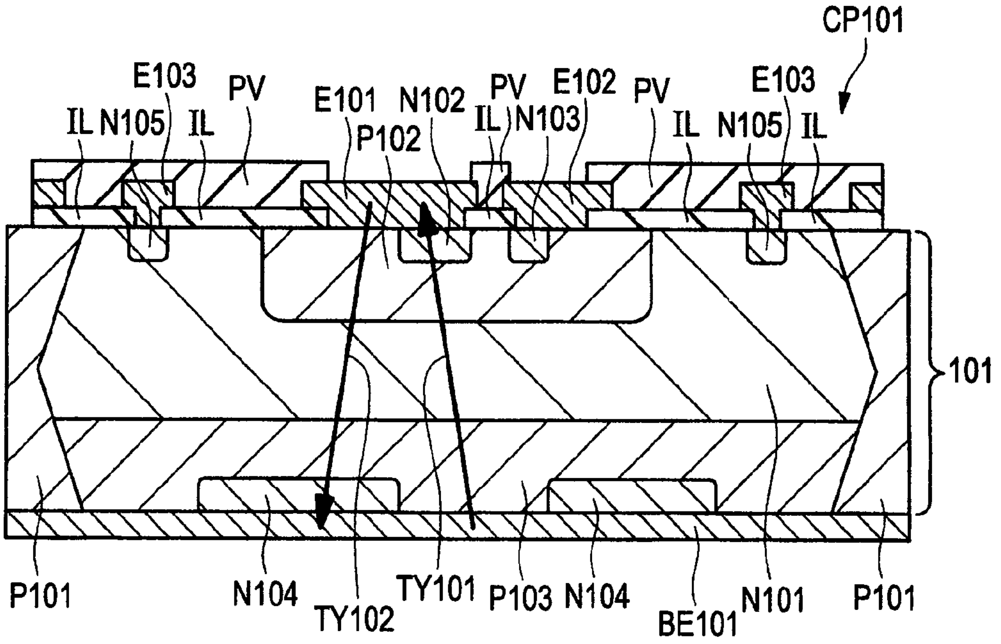
FIG. 18 is a sectional view of a semiconductor device according to a first comparative example.

FIG. 18 is a sectional view of the semiconductor device CP101 according to the first comparative example and shows a section corresponding to FIG. 2 showing the present embodiment.

The semiconductor device CP101 according to the first comparative example shown in FIG. 18 is also of a semiconductor device formed with a triac.

p-type semiconductor regions P101, a p-type semiconductor region P102, a p-type semiconductor region P103, an n-type semiconductor region N102, an n-type semiconductor region N103, an n-type semiconductor region N104 and an n-type semiconductor region N105 are formed in a semiconductor substrate 101 (one corresponding to the semiconductor substrate 1 of the present embodiment) that configures the semiconductor device CP101 according to the first comparative example. The semiconductor substrate 101 is of a semiconductor substrate comprised of n-type monocrystalline silicon or the like. In the semiconductor substrate 101, a region which does not serve as the p-type semiconductor regions P101, P102 and P103 and the n-type semiconductor regions N102, N103, N104 and N105, serves as an n-type substrate region (n-type semiconductor region) N101 which nearly maintains an impurity state of the semiconductor substrate 101 at the stage prior to the formation of these semiconductor regions.

The p-type semiconductor region P102 is formed on the front surface side of the semiconductor substrate 101. The n-type semiconductor region N102 (one corresponding to the n-type semiconductor region N2 employed in the present embodiment) and the n-type semiconductor region N103 (one corresponding to the n-type semiconductor region N3 employed in the present embodiment) are formed on the front surface side of the semiconductor substrate 101 to be internally included in the p-type semiconductor region P102 and separated from each other. The p-type semiconductor region P103 is formed on the back surface side of the semiconductor substrate 101. The n-type semiconductor region N104 (one corresponding to the n-type semiconductor region N4 employed in the present embodiment) is formed on the back surface side of the semiconductor substrate 101 to be internally included in the p-type semiconductor region P103. The p-type semiconductor region P101 (one corresponding to the p-type semiconductor region P1 employed in the present embodiment) is formed in an outer peripheral region of the semiconductor substrate 101. The n-type substrate region N101 (one corresponding to the n-type substrate region N1 employed in the present embodiment) is interposed between the p-type semiconductor region P102 and the p-type semiconductor region P103. The n-type semiconductor region N105 (one corresponding to the n-type semiconductor region N5 employed in the present embodiment) is formed on the front surface side of the semiconductor substrate 101 between the p-type semiconductor region P101 and the p-type semiconductor region P102 and is higher than the n-type substrate region N101 in impurity concentration. An electrode E101 (one corresponding to the electrode E1 employed in the present embodiment) is formed over the front surface of the semiconductor substrate 101 to be electrically coupled in contact with the n-type semiconductor region N102 and the p-type semiconductor region P102. An electrode E102 (one corresponding to the electrode E2 employed in the present embodiment) is formed over the front surface of the semiconductor substrate 101 to be electrically coupled in contact with the n-type semiconductor region N103 and the p-type semiconductor region P102. An electrode E103 (one corresponding to the electrode E3 employed in the present embodiment) is formed over the front surface of the semiconductor substrate 101 to be electrically coupled in contact with the n-type semiconductor region N105. A back surface electrode BE101 (one corresponding to the back surface electrode BE employed in the present embodiment) is formed over the back surface of the semiconductor substrate 101 to be electrically coupled in contact with the n-type semiconductor region N104 and the p-type semiconductor regions P101 and P103. Insulating films IL and PV are also formed over the front surface of the semiconductor substrate 101.

Thyristors TY101 and TY102 are formed in such a semiconductor device CP101 according to the first comparative example. Now, a current flows in the thyristor TY101 from the back surface electrode BE101 to the electrode E101 via the p-type semiconductor region P103, n-type substrate region N101, p-type semiconductor region P102 and n-type semiconductor region N102. A current flows in the thyristor TY102 from the electrode E101 to the back surface electrode BE101 via the p-type semiconductor region P102, n-type substrate region N101, p-type semiconductor region P103 and n-type semiconductor region N104. The electrode E102 can function as a gate terminal.

It has been found by discussions by the present inventors that the following problems occur in the semiconductor device CP101 according to the first comparative example configured in this way.

Since the breakdown voltage of the triac is determined principally depending on the junction surface of each PN junction, the relaxation of concentration of an electric field on the junction surface becomes important in enhancing the breakdown voltage. The breakdown voltage of the triac formed in the semiconductor device CP101 according to the first comparative example shown in FIG. 18 is determined principally by a PN junction between the n-type substrate region N101 and the p-type semiconductor region P102 and a PN junction between the n-type substrate region N101 and the p-type semiconductor region P103. Considering the PN junction between the n-type substrate region N101 and the p-type semiconductor region P102, lowing an impurity concentration of the p-type semiconductor region P102 and relaxing the concentration of an electric field in the neighborhood of the junction surface of the PN junction between the n-type substrate region N101 and the p-type semiconductor region P102 are effective to enhance the breakdown voltage of the junction surface between the n-type substrate region N101 and the p-type semiconductor region P102. When, however, the impurity concentration of the entire p-type semiconductor region P102 is made low in the semiconductor device CP101 according to the first comparative example, a commutation failure in the triac becomes easy to occur.

Namely, when a gate signal of a positive potential is inputted to the gate terminal (electrode E102 herein) upon turning on the thyristor TY101 from its off state, the potential of the p-type semiconductor region P102 becomes higher than that of the n-type semiconductor region P102, so that electrons are injected from the n-type semiconductor region N102 to the p-type semiconductor region P102. Namely, when the thyristor TY101 is turned on by the input of the gate signal, the electrons can sufficiently be injected from the n-type semiconductor region N102 to the p-type semiconductor region P102 by the gate voltage (voltage input to the gate terminal). Therefore, the thyristor TY101 can reliably be turned on without being so affected by the magnitude of the impurity concentration of the p-type semiconductor region P102. The failure in commutation, however, occurs due to the fact that the thyristor TY101 is turned on unintentionally by the injection of the electrons from the n-type semiconductor region N102 to the p-type semiconductor region P102 even without the application of the gate voltage. Increasing the impurity concentration of the p-type semiconductor region P102 is however effective in preventing the commutation failure. Even though such a phenomenon that electrons are injected into the p-type semiconductor region P102 from the n-type semiconductor region N102 by a slight quantity occurs without the gate voltage being input, the electrons injected into the p-type semiconductor region P102 can be made extinctive or annihilated by being bound with holes of the p-type semiconductor region P102 if the impurity concentration of the p-type semiconductor region P102 is set high. It is therefore possible to prevent the thyristor TY101 from being turned on unintentionally. Therefore, the enhancement of the impurity concentration in the p-type semiconductor region P102 is effective in suppressing the commutation failure.

Thus, in the semiconductor device CP101 according to the first comparative example, the breakdown voltage is enhanced but the failure in commutation is easy to occur where the impurity concentration of the p-type semiconductor region P102 is set low. On the other hand, when the impurity concentration of the p-type semiconductor region P102 is set high, the failure in commutation becomes hard to occur, but the breakdown voltage is reduced. It can be said that the p-type semiconductor region P103 is also similar to the above. When the impurity concentration of the p-type semiconductor region P103 is set low, the breakdown voltage is enhanced but the failure in commutation (that the thyristor TY102 is turned on unintentionally) becomes easy to occur. On the other hand, when the impurity concentration of the p-type semiconductor region P103 is set high, the failure in commutation (that the thyristor TY102 is turned on unintentionally) becomes hard to occur, but the breakdown voltage is reduced. It is therefore hard to allow compatibility between the enhancement of the breakdown voltage and the suppression of the failure in commutation in the semiconductor device CP101 according to the first comparative example.

On the other hand, in the semiconductor device CP1 according to the present embodiment, the p-type semiconductor regions P4 and P2 are provide on the front surface side of the semiconductor substrate 1. The p-type semiconductor region P2 is set as the low impurity concentration, and the p-type semiconductor region P4 is set as the high impurity concentration (impurity concentration higher than that of the p-type semiconductor region P2). Further, the p-type semiconductor regions P5 and P3 are provided on the back surface side of the semiconductor substrate 1. The p-type semiconductor region P3 is set as the low impurity concentration, and the p-type semiconductor region P5 is set as the high impurity concentration (impurity concentration higher than that of the p-type semiconductor region P3). The n-type semiconductor region N2 and the n-type semiconductor region N3 are formed on the front surface side of the semiconductor substrate 1 to be internally included in the p-type semiconductor region P4 of the high impurity concentration and separated from each other. The n-type semiconductor region N4 is formed on the back surface side of the semiconductor substrate 1 to be internally included in the p-type semiconductor region P5 of the high impurity concentration.

The PN junction that determines the breakdown voltage at each of the thyristors TY1 and TY2 in the semiconductor device CP1 according to the present embodiment is formed by the PN junction surface between the n-type substrate region N1 and the p-type semiconductor region P2 of the low impurity concentration and the PN junction surface between the n-type substrate region N1 and the p-type semiconductor region P3 of the low impurity concentration. Since the p-type semiconductor region P2 of the low impurity concentration is interposed between the n-type substrate region N1 and the p-type semiconductor region P4 of the high impurity concentration, and the p-type semiconductor region P3 of the low impurity concentration is interposed between the n-type substrate region N1 and the p-type semiconductor region P5 of the high impurity concentration, the p-type semiconductor regions P4 and P5 of the high impurity concentrations do not form a PN junction with the n-type substrate region N1.

Thus, in the semiconductor device CP1 according to the present embodiment, the p-type semiconductor regions each used to form the PN junction surface for determining the breakdown voltage of the triac between each of them and the n-type substrate region N1 are configured by the p-type semiconductor regions P2 and P3 of the low impurity concentrations. It is therefore possible to relax the concentration of an electric field in the vicinity of each of the PN junction surfaces (corresponding to the PN junction surface between the n-type substrate region N1 and the p-type semiconductor region P2 and the PN junction surface between the n-type substrate region N1 and the p-type semiconductor region P3). It is thus possible to enhance the breakdown voltage of (triac formed in) the semiconductor device CP1.

In the semiconductor device CP1 according to the present embodiment, the n-type semiconductor region N2 and the n-type semiconductor region N3 are formed so as to be internally included in the p-type semiconductor region P4 of the high impurity concentration. The p-type semiconductor region P4 of the high impurity concentration is interposed between the n-type semiconductor regions N2 and N3 and the p-type semiconductor region P2 of the low impurity concentration. Further, the n-type semiconductor region N4 is formed so as to be internally included in the p-type semiconductor region P5 of the high impurity concentration. The p-type semiconductor region P5 of the high impurity concentration is interposed between the n-type semiconductor region N4 and the p-type semiconductor region P3 of the low impurity concentration. It is therefore possible to suppress or prevent the occurrence of the commutation failure of the triac formed in the semiconductor device CP1.

Namely, the failure in commutation (unintentional turning on of thyristor TY1) occurs due to the fact that the thyristor TY1 is turned on unintentionally due to the electrons being injected from the n-type semiconductor region N2 to the p-type semiconductor region P4, even without the application of the gate voltage (voltage input to the electrode E1). On the other hand, in the present embodiment, since the quantity of holes of the p-type semiconductor region P4 can be increased by setting high the impurity concentration of the p-type semiconductor region P4, the electrons injected into the p-type semiconductor region P4 can be annihilated by being bound with the holes of the p-type semiconductor region P4 even if such a phenomenon that the electrons are injected into the p-type semiconductor region P4 from the n-type semiconductor region N2 by a slight quantity occurs without the gate voltage being applied. It is therefore possible to suppress or prevent the unintentional turning on of the thyristor TY1 without the application of the gate voltage. Accordingly, the commutation failure in the triac formed in the semiconductor device CP1 can be suppressed or prevented.

The failure in commutation (unintentional turning on of thyristor TY2) occurs due to the fact that the thyristor TY2 is turned on unintentionally due to the electrons being injected from the n-type semiconductor region N4 to the p-type semiconductor region P5, even without the application of the gate voltage (voltage input to the electrode E1). On the other hand, in the present embodiment, since the quantity of holes of the p-type semiconductor region P5 can be increased by setting high the impurity concentration of the p-type semiconductor region P5, the electrons injected into the p-type semiconductor region P5 can be annihilated by being bound with the holes of the p-type semiconductor region P5 even though such a phenomenon that the electrons are injected into the p-type semiconductor region P5 from the n-type semiconductor region N4 by a slight quantity occurs without the gate voltage being applied. It is therefore possible to suppress or prevent the unintentional turning on of the thyristor TY2 without the application of the gate voltage. Accordingly, the commutation failure in the triac formed in the semiconductor device CP1 can be suppressed or prevented.

Namely, the p-type semiconductor region P4 is set as the high impurity concentration in such a manner that the electrons injected from the n-type semiconductor region N2 to the p-type semiconductor region P4 can be annihilated with the holes of the p-type semiconductor region P4 at other than upon the application of the gate voltage, thus making it possible to suppress or prevent the unintentional turning on of the thyristor TY1 and thereby suppress or prevent the commutation failure in the triac (semiconductor device CP1). The p-type semiconductor region P5 is set as the high impurity concentration in such a manner that the electrons injected from the n-type semiconductor region N4 to the p-type semiconductor region P5 can be annihilated with the holes of the p-type semiconductor region P5 at other than upon the application of the gate voltage, thus making it possible to suppress or prevent the unintentional turning on of the thyristor TY2 and thereby suppress or prevent the commutation failure in the triac (semiconductor device CP1). Namely, the provision of the p-type semiconductor regions P4 and P5 of the high impurity concentrations enables suppression of voltage fluctuations due to carriers at the commutation and increase the rate of change in current (di/dt)c corresponding to a possible limit of a failure in commutation.

Since the electrons can sufficiently be injected into the p-type semiconductor region P4 from the n-type semiconductor region N2 by the application of the gate voltage when the thyristor TY1 is turned on intentionally, the thyristor TY1 can reliably be turned on, even though the impurity concentration of the p-type semiconductor region P4 is high, without being affected by, such a high impurity concentration. Likewise, since the electrons can sufficiently be injected into the p-type semiconductor region P5 from the n-type semiconductor region N4 by the application of the gate voltage when the thyristor TY2 is turned on intentionally, the thyristor TY2 can reliably be turned on, even though the impurity concentration of the p-type semiconductor region P5 is high, without being affected by such a high impurity concentration.

Thus, the semiconductor device CP1 according to the present embodiment makes it possible to enhance its breakdown voltage and suppress or prevent the failure in commutation. Namely, it is possible for the semiconductor device CP1 (triac formed therein) to make compatibility between the enhancement of its breakdown voltage and the suppression (prevention) of the failure in commutation. Accordingly, the performance of the semiconductor device can be enhanced.

Since the semiconductor device CP1 (triac) itself is devised to make it hard to cause the failure in commutation in the present embodiment, the failure in commutation can be suppressed or prevented even without using the above CR absorber or the like. It is therefore possible to achieve reductions in cost and size of the electronic apparatus using the semiconductor device CP1 (triac).

If the present embodiment is seen from another point of view, the p-type semiconductor region (combined region of P2 and P4) located between the n-type semiconductor regions N2 and N3 and the n-type substrate region N1 is formed to be divided into the p-type semiconductor region P4 and the p-type semiconductor region P2 in such a manner that the region adjacent to the n-type semiconductor regions N2 and N3 can be brought to the high impurity concentration and the region adjacent to the n-type substrate region N1 can be brought to the low impurity concentration. The p-type semiconductor region P4 is set higher than the p-type semiconductor region P2 in impurity concentration to thereby enable the region adjacent to the n-type semiconductor regions N2 and N3, of the p-type semiconductor region located between the n-type semiconductor regions N2 and N3 and the n-type substrate region N1 to assume the high impurity concentration and to enable the region adjacent to the n-type substrate region N1, of the p-type semiconductor region to assume the low impurity concentration, thus making it possible to achieve enhancement of a breakdown voltage and suppression (prevention) of a failure in commutation. The p-type semiconductor region (combined region of P3 and P5) located between the n-type semiconductor region N4 and the n-type substrate region N1 is formed and divided into the p-type semiconductor region P5 and the p-type semiconductor region P3 in such a manner that the region adjacent to the n-type semiconductor region N4 can be brought to the high impurity concentration and the region adjacent to the n-type substrate region N1 can be brought to the low impurity concentration. The p-type semiconductor region P5 is set higher than the p-type semiconductor region P3 in impurity concentration to thereby enable the region adjacent to the n-type semiconductor region N4, of the p-type semiconductor region located between the n-type semiconductor region N4 and the n-type substrate region N1 to assume the high impurity concentration and to enable the region adjacent to the n-type substrate region N1 to assume the low impurity concentration, thus making it possible to achieve enhancement of a breakdown voltage and suppression (prevention) of a failure in commutation.

The following advantages are also brought about by the configuration of the p-type semiconductor region (combined region of P2 and P4) located between the n-type semiconductor regions N2 and N3 and the n-type substrate region N1 by the p-type semiconductor region P4 of the high impurity concentration and the p-type semiconductor region P2 of the low impurity concentration. Namely, since a depletion layer extending from the PN junction surface between the n-type substrate region N1 and the p-type semiconductor region P2 to the p-type semiconductor region P2 side can be suppressed by the p-type semiconductor region P4 of the high impurity concentration, it is possible to cause the p-type semiconductor region P4 to function as a punchthrough stopper and prevent unintentional turning-on due to punchthrough to the n-type semiconductor region N2.

The following advantages are also brought about by the configuration of the p-type semiconductor region (combined region of P3 and P5) located between the n-type semiconductor region N4 and the n-type substrate region N1 by the p-type semiconductor region P5 of the high impurity concentration and the p-type semiconductor region P3 of the low impurity concentration. Namely, since a depletion layer extending from the PN junction surface between the n-type substrate region N1 and the p-type semiconductor region P3 to the p-type semiconductor region P3 side can be suppressed by the p-type semiconductor region P5 of the high impurity concentration, it is possible to cause the p-type semiconductor region P5 to function as a punchthrough stopper and prevent unintentional turning-on due to punchthrough to the n-type semiconductor region N4.

Since the p-type semiconductor region with which the electrode E1 is brought into contact is configured as the p-type semiconductor region P4 of the high impurity concentration, the contact resistance of the electrode E1 can be reduced. Further, since the p-type semiconductor region with which the back surface electrode BE is brought into contact is configured as the p-type semiconductor region P5 of the high impurity concentration, the contact resistance of the back surface electrode BE can be reduced.

In the semiconductor device CP101 according to the first comparative example, lowering the impurity concentration of the n-type substrate region N1 (i.e., increasing specific resistivity thereof) to thicken the semiconductor substrate 1 and deepening the thicknesses of the p-type semiconductor regions P102 and P103 are also effective in enhancing the breakdown voltage of the triac. In this case, however, the thickness of the semiconductor device CP101 becomes thick because the thickness of the semiconductor substrate 101 becomes thick, thus resulting in upsizing of the semiconductor device CP1 (increase in its thickness). Since the increase in the thickness of the semiconductor substrate 101 leads to difficulty to form the p-type semiconductor region P101, process control becomes difficult.

On the other hand, since the suppression of the failure in commutation can be controlled by the p-type semiconductor regions P4 and P5 in the semiconductor device CP1 according to the present embodiment, the breakdown voltage can be enhanced by lowering the impurity concentrations of the p-type semiconductor regions P2 and P3. Thus, if the same breakdown voltage is taken, the impurity concentrations of the n-type substrate regions (N1 and N101) can be made high as compared with the semiconductor device CP101 according to the first comparative example (the n-type substrate regions can be reduced in specific resistivity), and the thicknesses of the semiconductor substrates (1 and 101) can be made thin. Therefore, in the present embodiment, the thickness of the semiconductor device CP1 can be thinned and the semiconductor device CP1 can be brought into less thickness. An ability to make the thickness of the semiconductor substrate 1 thin leads to making it easy to form the p-type semiconductor region P1, so that process control becomes easy. The characteristic of the triac can be enhanced by reducing the specific resistivity of the n-type substrate region N1. Increasing the impurity concentration of the n-type substrate region N1 makes it easy to annihilate minority carriers in the n-type substrate region N1. Even from this point of view, the effect of suppressing the failure in commutation can be obtained.

Figure 19:
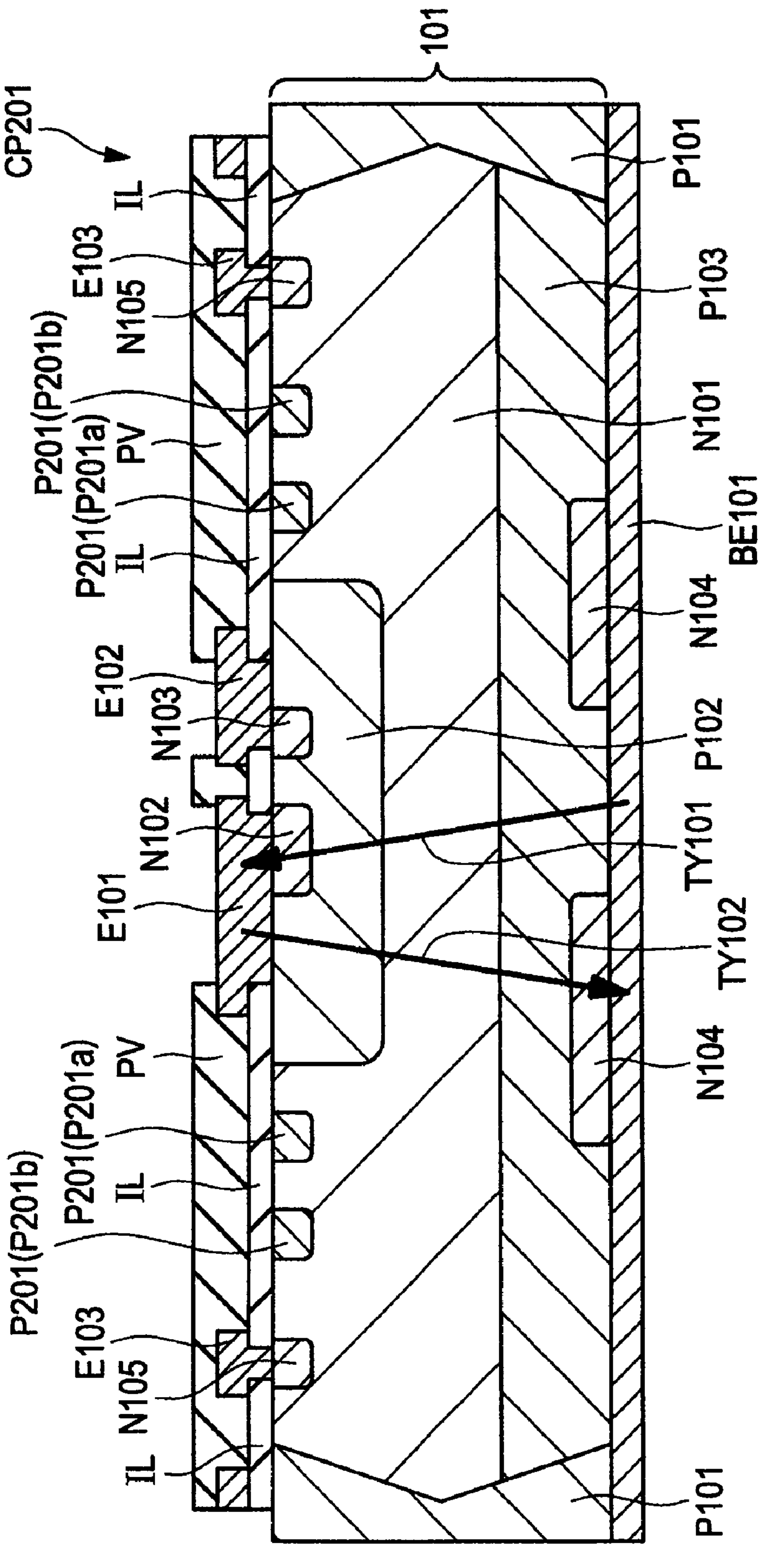
FIG. 19 is a sectional view of a semiconductor device according to a second comparative example.

Forming such ring-shaped p-type semiconductor regions P201 (whose planar forms are ring-shaped) as to surround a p-type semiconductor region P102, on the front surface side of the semiconductor substrate 101 between the p-type semiconductor region P102 and an n-type semiconductor region N105 as in a semiconductor device CP201 according to a second comparative example shown in FIG. 19 is also effective in enhancing the breakdown voltage of the triac. Now, FIG. 19 is a sectional view of the semiconductor device CP201 according to the second comparative example and shows a section corresponding to FIG. 2 of the present embodiment and FIG. 18 of the first comparative example. In the semiconductor device CP201 according to the second comparative example shown in FIG. 19, such ring-shaped p-type semiconductor regions P201*a* and P201*b* (whose planar forms are ring-shaped) as to surround the p-type semiconductor region P102 are formed between the p-type semiconductor region P102 and the n-type semiconductor region N105. The ring-shaped p-type semiconductor region P201*a* is provided inwardly of the ring-shaped p-type semiconductor region P201*b* (on the side close to the p-type semiconductor region P102).

When, however, the ring-shaped p-type semiconductor region P201 is formed to enhance a breakdown voltage as in the semiconductor device CP201 according to the second comparative example shown in FIG. 19, the size in the direction of the major surface of the semiconductor substrate 101 becomes large by its formation, thus resulting in an increase in the flat area of the semiconductor device CP201.

On the other hand, in the semiconductor device CP1 according to the present embodiment, since the impurity concentration of the p-type semiconductor region P2 is reduced to make it possible to enhance the breakdown voltage, a high breakdown voltage can be achieved even without forming one corresponding to the ring-shaped p-type semiconductor region P201. Therefore, the size in the direction of the major surface of the semiconductor substrate 1 can be suppressed, which becomes advantageous over a reduction in the area of the semiconductor device CP1.

Figure 20:
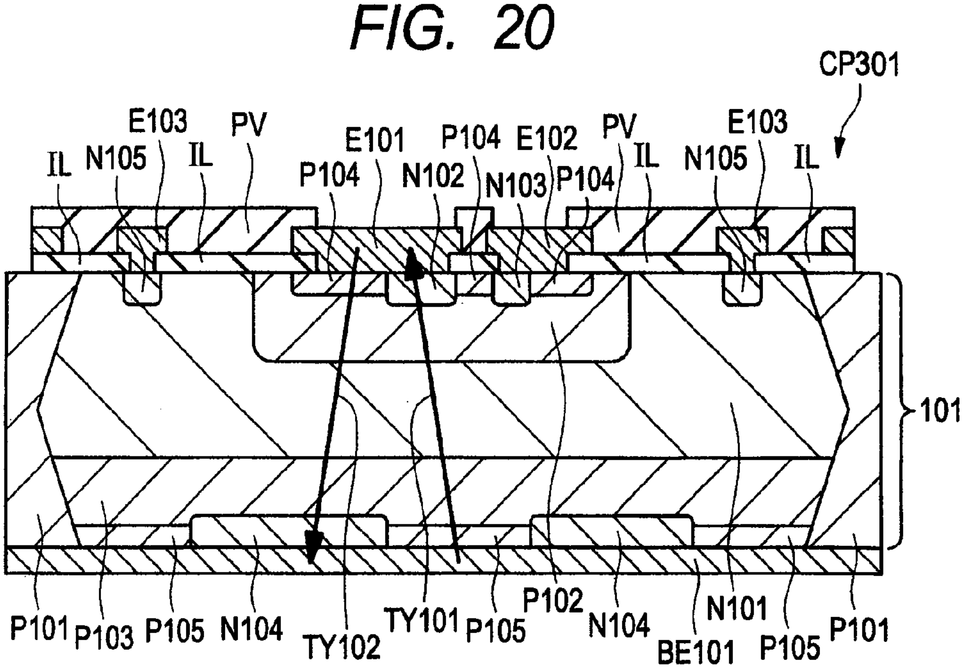
FIG. 20 is a sectional view of a semiconductor device according to a third comparative example.

FIG. 20 is a sectional view of a semiconductor device CP301 according to a third comparative example and shows a section corresponding to FIG. 2 of the present embodiment and FIG. 18 of the first comparative example.

The semiconductor device CP301 according to the third comparative example shown in FIG. 20 is of a semiconductor device formed with a triac.

The semiconductor device CP301 according to the third comparative example shown in FIG. 20 is different from the semiconductor device CP101 according to the first comparative example shown in FIG. 18 in that p-type semiconductor regions P104 and P105 are provided. In the semiconductor device CP301 according to the third comparative example, the p-type semiconductor region P104 is higher than a p-type semiconductor region P102 in impurity concentration, and the p-type semiconductor region P105 is higher than a p-type semiconductor region P103 in impurity concentration. The p-type semiconductor region P104 is formed in a surface layer portion of the p-type semiconductor region P102 on the front surface side of a semiconductor substrate 101, but n-type semiconductor regions N102 and N103 are not internally included in the p-type semiconductor region P104. The bottoms (bottom surfaces) of the n-type semiconductor regions N102 and N103 are in contact with the p-type semiconductor region P102 without contacting the p-type semiconductor region P104. The p-type semiconductor region P105 is formed in a surface layer portion of the p-type semiconductor region P103 on the back surface side of the semiconductor substrate 101, but an n-type semiconductor region N104 is not internally included in the p-type semiconductor region P105. The bottom (bottom surface) of the n-type semiconductor region N4 is in contact with the p-type semiconductor region P103 without contacting the p-type semiconductor region P105.

In the semiconductor device CP301 according to the third comparative example configured in this way, compatibility between the enhancement of a breakdown voltage and the suppression (prevention) of a failure in commutation cannot be achieved unlike the semiconductor device CP1 according to the present embodiment.

Namely, even in the case of the semiconductor device CP301 according to the third comparative example, when the impurity concentrations of the p-type semiconductor regions P102 and P103 are lowered in a manner similar to the semiconductor device CP101 according to the first comparative example, the breakdown voltage is enhanced, but the failure in commutation becomes easy to occur. This is because in the semiconductor device CP301 according to the third comparative example, the n-type semiconductor regions N102 and N103 are not internally included in the p-type semiconductor region P104, and the bottoms (bottom surfaces) of the n-type semiconductor regions N102 and N103 are brought into contact with the p-type semiconductor region P102 without contacting the p-type semiconductor region P104 of the high impurity concentration. This is also because the n-type semiconductor region N104 is not internally included in the p-type semiconductor region P105, and the bottom (bottom surface) of the n-type semiconductor region N104 is not in contact with the p-type semiconductor region P105 of the high impurity concentration but in contact with the p-type semiconductor region P103. In the semiconductor device CP301 according to the third comparative example, the failure in commutation occurs due to electrons injected from the n-type semiconductor regions N102 and N104 to the p-type semiconductor regions P102 and P103 at other than upon application of a gate voltage. Therefore, even though the p-type semiconductor regions P104 and P105 are set high in impurity concentration, it does not contribute to annihilation of the electrons injected from the n-type semiconductor regions N102 and N104 to the p-type semiconductor regions P102 and P103. It is therefore not possible to obtain the effect of suppressing the failure in commutation.

On the other hand, in the semiconductor device CP1 according to the present embodiment, the n-type semiconductor regions N2 and N3 are internally included in the p-type semiconductor region P4, and the bottoms (bottom surfaces) of the n-type semiconductor regions N2 and N3 are not in contact with the p-type semiconductor region P2 of the low impurity concentration but in contact with the p-type semiconductor region P4. Further, the n-type semiconductor region N4 is internally included in the p-type semiconductor region P5, and the bottom (bottom surface) of the n-type semiconductor region N4 is not in contact with the p-type semiconductor region P3 of the low impurity concentration but in contact with the p-type semiconductor region P5. In this case, the failure in commutation occurs due to the electrons injected from the n-type semiconductor regions N2 and N4 to the p-type semiconductor regions P3 and P5 at other than upon the application of the gate voltage. Since this can however be suppressed or prevented by setting the p-type semiconductor regions P3 and P5 as the high impurity concentrations respectively, such suppression or prevention is compatible with the breakdown voltage enhancement effect due to the fact that the impurity concentrations of the p-type semiconductor regions P2 and P4 are reduced. It is thus possible to achieve compatibility between the enhancement of the breakdown voltage and the suppression (prevention) of the failure in commutation.

In the semiconductor device CP1 according to the present embodiment, the p-type semiconductor region P1 is preferably formed in the outer peripheral region of the semiconductor substrate 1. Therefore, the n-type substrate region N1 is not exposed at the side surface of the semiconductor substrate 1 that configures the semiconductor device CP1, and serves as the side surface configured by the p-type semiconductor region P1. With the formation of the p-type semiconductor region P1 in the outer peripheral region of the semiconductor substrate 1, the effect of preventing the exposure of the PN junction between the n-type substrate region N1 and the p-type semiconductor region P3 to the dicing surface (side surface of semiconductor substrate 1) by exposing the PN junction to the first major surface can be obtained.

In the semiconductor device CP1 according to the present embodiment, the n-type semiconductor region N5 higher in impurity concentration than the n-type substrate region N1 is preferably formed on the front surface side of the semiconductor substrate 1 between the p-type semiconductor region P1 and the p-type semiconductor region P2 (so as to surround the p-type semiconductor region P2). Further, the electrode E3 is more preferably formed above the n-type semiconductor region N5. It is thus possible to obtain the effect of suppressing the spread of an electric field in the surface (lateral) direction.

In the semiconductor device CP1 according to the present embodiment, the p-type semiconductor region P2, p-type semiconductor region P4, n-type semiconductor region N2, n-type semiconductor region N3 and n-type semiconductor region N5 are formed on the front surface side of the semiconductor substrate 1. The p-type semiconductor region P3, p-type semiconductor region P5 and n-type semiconductor region N4 are formed on the back surface side of the semiconductor substrate 1. The p-type semiconductor region P1 is formed in the outer peripheral region of the semiconductor substrate 1. These semiconductor regions (P1, P2, P3, P4, P5, N2, N3, N4 and N5) are formed using the thermal diffusion (i.e., thermal diffusion process) of the impurity into the semiconductor substrate 1W from the front or back surface of the semiconductor substrate 1W.

Since the p-type semiconductor regions P2 and P4 and the n-type semiconductor regions N2, N3 and N5 formed on the front surface side of the semiconductor substrate 1 are formed by thermally diffusing the impurity into the semiconductor substrate 1 (1W) from the front surface side of the semiconductor substrate 1 (1W), it is necessary to form the semiconductor regions whose depths are deep as viewed from the front surface of the semiconductor substrate 1 (1W) ahead of the remaining semiconductor regions. Since the n-type semiconductor regions N2 and N3 are internally included in the p-type semiconductor region P4, and the p-type semiconductor region P4 is internally included in the p-type semiconductor region P2 in the present embodiment, the p-type semiconductor region P2 is deeper than the p-type semiconductor region P4 and the n-type semiconductor regions N2 and N3 in depth from the front surface of the semiconductor substrate 1 (1W), and the p-type semiconductor region P4 is deeper than the n-type semiconductor regions N2 and N3 in depth from the front surface thereof. Therefore, of the p-type semiconductor region P2, p-type semiconductor region P4 and n-type semiconductor regions N2 and N3, the p-type semiconductor region P2 is first formed (i.e., the thermal diffusion process for the formation of the p-type semiconductor region P2 is performed). Thereafter, the p-type semiconductor region P4 is formed (i.e., the thermal diffusion process for the formation of the p-type semiconductor region P4 is performed). Further, the n-type semiconductor regions N2 and N3 are thereafter formed (i.e., the thermal diffusion process for the formation of the n-type semiconductor regions N2 and N3 is performed). Consequently, the p-type semiconductor region P4 can be formed to be internally included in the p-type semiconductor region P2, and the n-type semiconductor regions N2 and N3 can be formed to be internally included in the p-type semiconductor region P4.

The n-type semiconductor region N2 and the n-type semiconductor region N3 can also be formed in another process (another thermal diffusion process), but more preferred is if formed in the same process (same thermal diffusion process) because the number of manufacturing process steps for the semiconductor device can be reduced. When the n-type semiconductor region N2 and the n-type semiconductor region N3 are formed in the same process (same thermal diffusion process), the n-type semiconductor region N2 and the n-type semiconductor region N3 become approximately the same in depth from the front surface of the semiconductor substrate 1 (1W). Further preferred is if the n-type semiconductor region N5 is also formed in the same process as for the n-type semiconductor region N2 and the n-type semiconductor region N3 because the number of the manufacturing process steps for the semiconductor device can be reduced.

Since the p-type semiconductor regions P3 and P5 and the n-type semiconductor region N4 formed on the back surface side of the semiconductor substrate 1 are formed by thermally diffusing the impurity into the semiconductor substrate 1 (1W) from the back surface side of the semiconductor substrate 1 (1W), it is necessary to form the semiconductor regions whose depths are deep as viewed from the back surface of the semiconductor substrate 1 (1W) ahead of the remaining semiconductor regions. Since the n-type semiconductor region N4 is internally included in the p-type semiconductor region P5, and the p-type semiconductor region P3 is interposed between the p-type semiconductor region P5 and the n-type substrate region N1 in the present embodiment, the p-type semiconductor region P3 is deeper than the p-type semiconductor region P5 and the n-type semiconductor region N4 in depth from the back surface of the semiconductor substrate 1 (1W), and the p-type semiconductor region P5 is deeper than the n-type semiconductor region N4 in depth from the back surface of the semiconductor substrate 1 (1W). Therefore, of the p-type semiconductor regions P3 and P5 and the n-type semiconductor region N4, the p-type semiconductor region P3 is first formed (i.e., the thermal diffusion process for the formation of the p-type semiconductor region P3 is performed). Thereafter, the p-type semiconductor region P5 is formed (i.e., the thermal diffusion process for the formation of the p-type semiconductor region P5 is performed). Further, the n-type semiconductor region N4 is thereafter formed (i.e., the thermal diffusion process for the formation of the n-type semiconductor region N4 is performed). Consequently, the n-type semiconductor region N4 can be formed to be internally included in the p-type semiconductor region P5, and the p-type semiconductor region P3 can be interposed between the p-type substrate region P5 and the n-type substrate region N1.

More preferred is if the p-type semiconductor region P2 and the p-type semiconductor region P3 are formed in the same process (same thermal diffusion process) as shown in FIG. 6, because the number of the manufacturing process steps for the semiconductor device can be reduced. More preferred is if the p-type semiconductor region P4 and the p-type semiconductor region P5 are formed in the same process (same thermal diffusion process) as shown in FIG. 7, because the number of the manufacturing process steps for the semiconductor device can be reduced. More preferred is if the n-type semiconductor region N2, n-type semiconductor region N3, n-type semiconductor region N4 and n-type semiconductor region N5 are formed in the same process (same thermal diffusion process) as shown in FIG. 8, because the number of the manufacturing process steps for the semiconductor device can be reduced.

Since the triac is of a device which allows a large electric current (e.g., about a few A to about a few tens of A) to flow, there is a need to ensure its volume to some extent for the purpose of suppressing heat generation. The triac needs to increase the volume thereof and suppress the amount of generated heat per unit volume in such a manner that the device is not destroyed even if a surge current ranging from a few tens of A to a few hundred of A momentarily flows in the triac. It is therefore necessary for the semiconductor substrate 1 (1W) to diffuse an impurity to a fairly deep position and form the p-type semiconductor regions P1, P2, P3, P4 and P5 and the n-type semiconductor regions N2, N3, N4 and N5. It is therefore difficult to form these semiconductor regions (P1, P2, P3, P4, P5, N2, N3, N4 and N5) by only ion implantation. These semiconductor regions (P1, P2, P3, P4, P5, N2, N3, N4 and N5) are formed by a thermal diffusion process for diffusing the impurity into the semiconductor substrate 1 (1W) by heat treatment. Further, since it is necessary to diffuse the impurity to the fairly deep position in the semiconductor substrate 1 (1W) as describe above, the thermal diffusion process takes a long time at a high temperature as compared with the general manufacture of a semiconductor device.

It is important that in order to enable compatibility between the prevention of the commutation failure and the enhancement of the breakdown voltage as mentioned above, the p-type semiconductor region P4 of the p-type semiconductor region P2 and the p-type semiconductor region P4 formed on the front surface side of the semiconductor substrate 1 (1W) is formed to be shallower than the p-type semiconductor region P2 (or be internally included in the p-type semiconductor region P2) and to be higher in impurity concentration than the p-type semiconductor region P2. It is therefore important that the thermal diffusion process for the formation of the p-type semiconductor region P4 is performed after the thermal diffusion process for the formation of the p-type semiconductor region P2 has been carried out. Specifically, the p-type semiconductor region P2 is formed by introducing a p-type impurity into the neighborhood (surface layer portion on the front surface side) of the surface of the semiconductor substrate 1W by ion implantation for the p-type semiconductor region P2 and then diffusing the p-type impurity into the semiconductor substrate 1W by the thermal diffusion process (heat treatment) for the formation of the p-type semiconductor region P2. The p-type semiconductor region P4 is formed by introducing a p-type impurity into the neighborhood (surface layer portion on the front surface side) of the surface of the semiconductor substrate 1W by ion implantation for the p-type semiconductor region P4 and then diffusing the p-type impurity into the semiconductor substrate 1W by the thermal diffusion process (heat treatment) for the formation of the p-type semiconductor region P4. It is therefore necessary to perform these processes in order of the ion implantation for the p-type semiconductor region P2, the thermal diffusion process (heat treatment) for the formation of the p-type semiconductor region P2, the ion implantation for the p-type semiconductor region P4, and the thermal diffusion process (heat treatment) for the formation of the p-type semiconductor region P4.

In order to allow compatibility between the prevention of the failure in commutation and the enhancement of the breakdown voltage, the amount of dose for the ion implantation for the p-type semiconductor region P4 conducted prior to the thermal diffusion process (heat treatment) for the formation of the p-type semiconductor region P4 is set larger (greater) than the amount of dose for the ion implantation for the p-type semiconductor region P2 conducted prior to the thermal diffusion process (heat treatment) for the formation of the p-type semiconductor region P2 from the viewpoint that the p-type semiconductor region P4 is set as the high impurity concentration and the p-type semiconductor region P2 is set as the low impurity concentration. Further, the amount of dose for the ion implantation for the p-type semiconductor region P4 conducted prior to the thermal diffusion process (heat treatment) for the formation of the p-type semiconductor region P4 is more preferably set to 10 to 5000 times the amount of dose for the ion implantation for the p-type semiconductor region P2 conducted prior to the thermal diffusion process (heat treatment) for the formation of the p-type semiconductor region P2. Thus, the difference in impurity concentration between the p-type semiconductor region P4 and the p-type semiconductor region P2 can appropriately be ensured, and the effect of preventing the failure in commutation and the effect of enhancing the breakdown voltage can adequately be obtained.

The above relationship between the p-type semiconductor region P4 and the p-type semiconductor region P2 can be applied even to the p-type semiconductor region P5 and the p-type semiconductor region P3 from a similar viewpoint.

Described specifically, the p-type semiconductor region P3 is formed by introducing a p-type impurity into the neighborhood (surface layer portion on the back surface side) of the back surface of the semiconductor substrate 1W by ion implantation for the p-type semiconductor region P3 and then diffusing the p-type impurity into the semiconductor substrate 1W by the thermal diffusion process (heat treatment) for the formation of the p-type semiconductor region P3. The p-type semiconductor region P5 is formed by introducing a p-type impurity into the neighborhood (surface layer portion on the back surface side) of the back surface of the semiconductor substrate 1W by ion implantation for the p-type semiconductor region P5 and then diffusing the p-type impurity into the semiconductor substrate 1W by the thermal diffusion process (heat treatment) for the formation of the p-type semiconductor region P5. It is therefore necessary to perform these processes in order of the ion implantation for the p-type semiconductor region P3, the thermal diffusion process (heat treatment) for the formation of the p-type semiconductor region P3, the ion implantation for the p-type semiconductor region P5, and the thermal diffusion process (heat treatment) for the formation of the p-type semiconductor region P5. More preferred is if the amount of dose for the ion implantation for the p-type semiconductor region P5 conducted prior to the thermal diffusion process (heat treatment) for the formation of the p-type semiconductor region P5 is set larger (greater) than the amount of dose for the ion implantation for the p-type semiconductor region P3 conducted prior to the thermal diffusion process (heat treatment) for the formation of the p-type semiconductor region P3, and is set to 10 to 5000 times the amount of dose for the ion implantation for the p-type semiconductor region P3. Thus, the difference in impurity concentration between the p-type semiconductor region P5 and the p-type semiconductor region P3 can appropriately be ensured, and the effect of preventing the failure in commutation and the effect of enhancing the breakdown voltage can adequately be obtained.

The thermal diffusion process (thermal diffusion process conducted to obtain the structure of FIG. 6 from the state, of FIG. 5) for the formation of the p-type semiconductor region P2 is preferably performed for a longer period of time than the time for the thermal diffusion process (thermal diffusion process conducted to obtain the structure of FIG. 7 from the state of FIG. 6) for the formation of the p-type semiconductor region P4 (i.e., the time for heat treatment is preferably made longer than the time therefor) in such a manner that the difference in depth (depth as viewed from the front surface of the semiconductor substrate 1) between the p-type semiconductor region P4 and the p-type semiconductor region P2 can sufficiently be ensured.

The thermal diffusion process (thermal diffusion process conducted to obtain the structure of FIG. 6 from the state of FIG. 5) for the formation of the p-type semiconductor region P3 is preferably performed for a longer period of time than the time for the thermal diffusion process (thermal diffusion process conducted to obtain the structure of FIG. 7 from the state of FIG. 6) for the formation of the p-type semiconductor region P5 (i.e., the time for heat treatment is preferably made longer than the time therefor) in such a manner that the difference in depth (depth as viewed from the front surface of the semiconductor substrate 1) between the p-type semiconductor region P5 and the p-type semiconductor region P3 can sufficiently be ensured.

Figure 21:
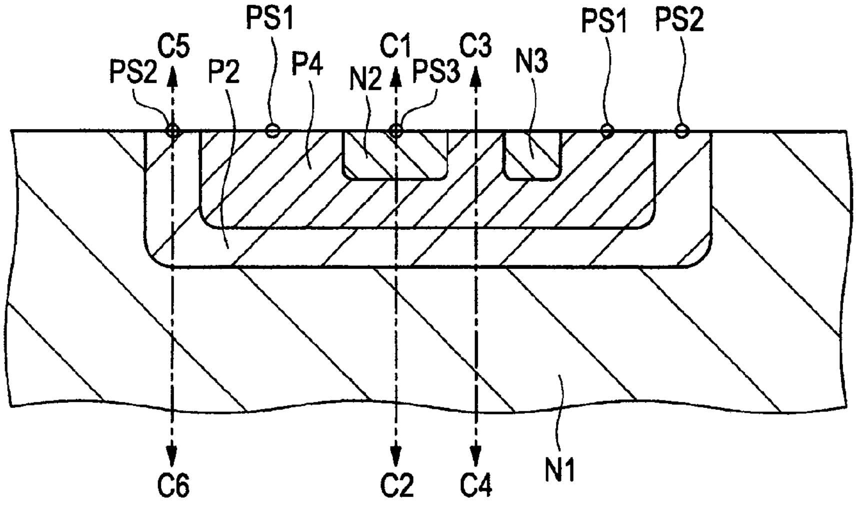
FIG. 21 is a fragmentary sectional view of the semiconductor device showing the one embodiment of the present invention.
Figure 22:
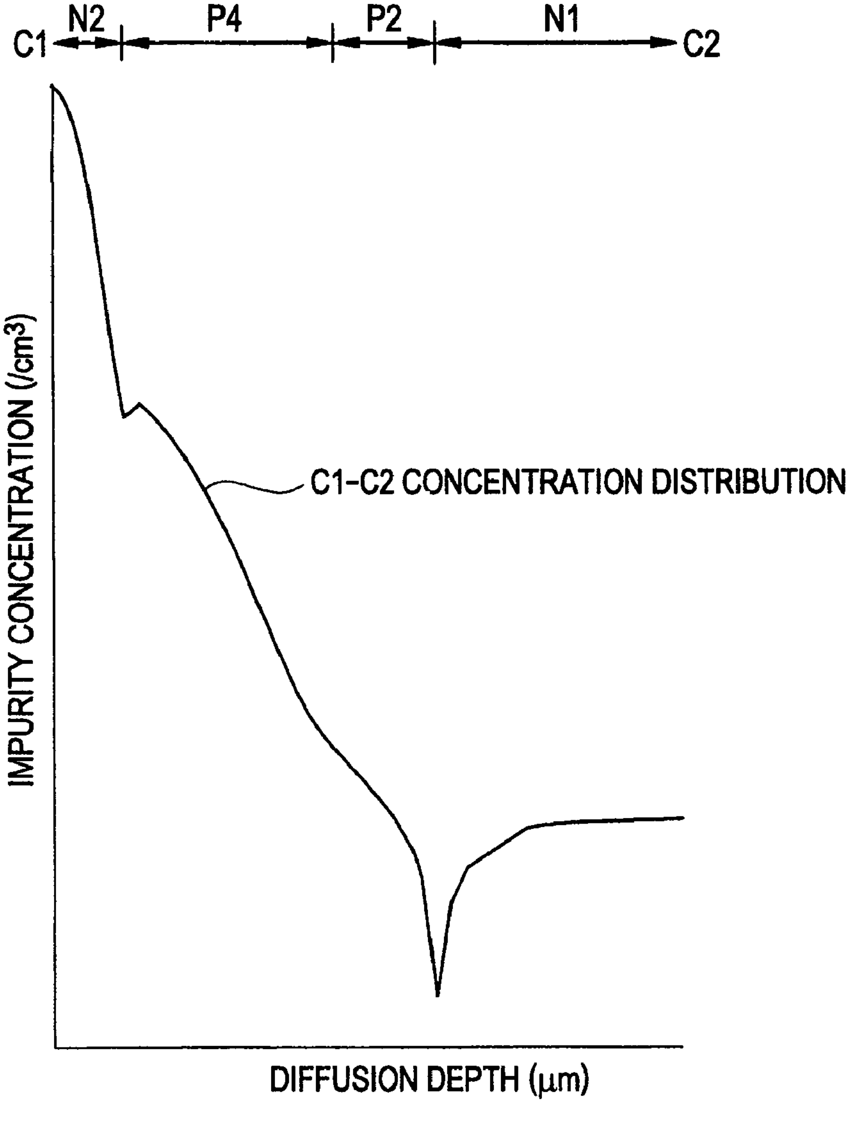
FIG. 22 is a graph showing one example of an impurity concentration distribution in a depth direction of a semiconductor substrate.
Figure 23:
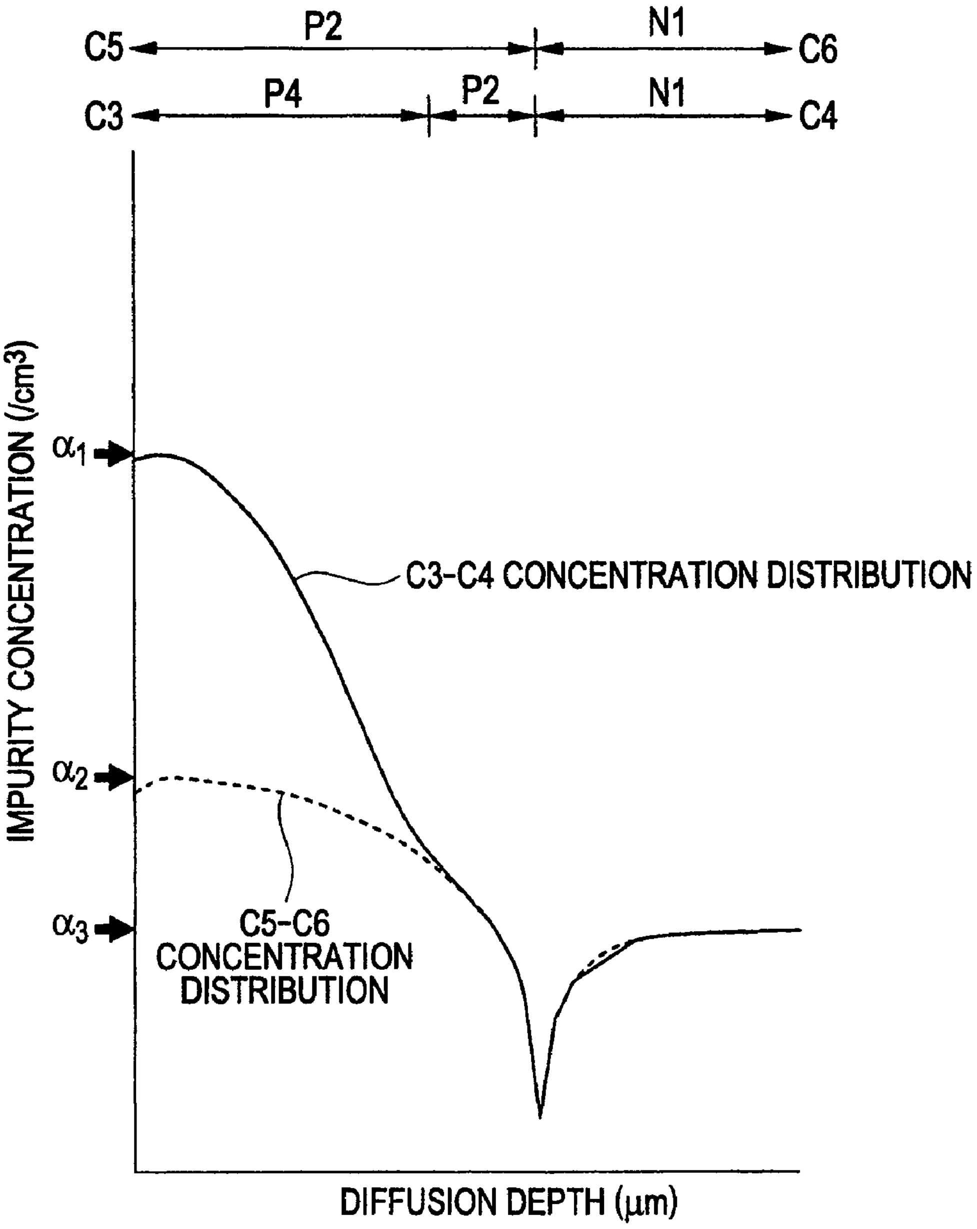
FIG. 23 is a graph illustrating one example of an impurity concentration distribution in the depth direction of the semiconductor substrate.

FIG. 21 is a fragmentary sectional view (partly enlarged sectional view) of the semiconductor device CP1 according to the present embodiment and shows, in enlarged form, parts of the n-type semiconductor regions N2 and N3 and p-type semiconductor regions P2 and P4, and the n-type substrate region N1 lying therearound at the section corresponding to FIG. 2. FIGS. 22 and 23 are respectively graphs (explanatory diagrams) showing one example illustrative of impurity concentration distributions in the direction of the depth of the semiconductor substrate 1 that configures the semiconductor device CP1. The horizontal axis of the graph shown in each of FIGS. 22 and 23 corresponds to the depth from the front surface of the semiconductor substrate 1, and the vertical axis of the graph shown in each of FIGS. 22 and 23 corresponds to the impurity concentration. FIGS. 22 and 23 are shown in semilogarithmic graph form. The vertical axis corresponds to a logarithmic scale. Since FIGS. 22 and 23 show one example illustrative of the concentration distributions, the representation of actual numerical values is omitted. An impurity concentration distribution at a position taken along line C1-C2 in FIG. 21 is shown in the graph of FIG. 22 by a solid line. An impurity concentration distribution at a position taken along line C3-C4 in FIG. 21 is shown in the graph of FIG. 23 by a solid line. An impurity concentration distribution at a position taken along line C5-C6 in FIG. 21 is shown in the graph of FIG. 23 by a dotted line. Incidentally, since the dotted line (impurity concentration distribution at the position taken along line C5-C6) approximately overlaps with the solid line (impurity concentration distribution at the position taken along line C3-C4) in the regions corresponding to the p-type semiconductor region P2 and the n-type substrate region N1 in the graph of FIG. 23, the dotted line is not shown. The impurity concentration distributions can be measured by, for example, SRP (Spreading Resistance Profiler) measurements.

The respective impurity concentrations of the n-type semiconductor region N2, p-type semiconductor region P2 and p-type semiconductor region P4 can also be assumed to be constant within the respective semiconductor regions (in this case, the graphs of FIGS. 22 and 23 are made stepwise). As shown in FIGS. 22 and 23, however, the n-type semiconductor region N2, the p-type semiconductor region P2 and the p-type semiconductor region P4 may respectively have such impurity concentration distributions that as the depth from the front surface of the semiconductor substrate 1 becomes deep, the impurity concentrations are reduced. This is because the respective semiconductor regions (N2, N3, N4, N5, P1, P2, P3, P4 and P5) are formed using the thermal diffusion. When an impurity is diffused to a position deep from the front surface of the semiconductor substrate by thermal diffusion, the highest impurity concentration is reached in the vicinity of the front surface of the semiconductor substrate 1. As the depth from the front surface of the semiconductor substrate 1 becomes deep, it is apt to reach such a concentration distribution that the impurity concentration is lowered.

In the present embodiment, however, the p-type semiconductor region P2 and the p-type semiconductor region P4 are formed in a divided fashion in manufacture, and the thermal diffusion process (heat treatment) for the formation of the p-type semiconductor region P4 is performed after the thermal diffusion process (heat treatment) for the formation of the p-type semiconductor region P2. Further, the amount of dose for the ion implantation for the p-type semiconductor region P4 conducted prior to the thermal diffusion process (heat treatment) for the formation of the p-type semiconductor region P4 is made larger (greater) than the amount of dose for the ion implantation for the p-type semiconductor region P2 conducted prior to the thermal diffusion process (heat treatment) for the formation of the p-type semiconductor region P2. Therefore, even if the concentration distribution that the impurity concentration is lowered as the depth from the front surface of the semiconductor substrate 1 becomes deep is reached as shown in FIGS. 22 and 23, the difference in impurity concentration between the p-type semiconductor region P2 and the p-type semiconductor region P4 can be made larger in the present embodiment.

Namely, in the case of the present embodiment in which the p-type semiconductor region P2 and the p-type semiconductor region P4 are formed in the divided fashion in the manufacturing process as compared with the case in which the region to be taken as the p-type semiconductor region P4 is also left as the p-type semiconductor region P2 without forming the p-type semiconductor region P4 unlike the present embodiment, the impurity concentration of the p-type semiconductor region (P4) adjacent to the n-type semiconductor regions N2 and N3 can be enhanced while the impurity concentration of the p-type semiconductor region (P2) adjacent to the n-type substrate region N1 is being reduced low. This can be said even where the concentration distribution that the impurity concentration is lowered as the depth from the front surface of the semiconductor substrate 1 becomes deep is reached as shown in FIGS. 22 and 23. The effect of suppressing (preventing) a failure in commutation can therefore be enhanced.

In the case of the present embodiment in which the p-type semiconductor region P2 and the p-type semiconductor region P4 are formed in the divided fashion in the manufacturing process as compared with the case in which the p-type semiconductor region P4 is formed to a depth equal to the region to be taken as the p-type semiconductor region P2 without forming the p-type semiconductor region P2 unlike the present embodiment, the impurity concentration of the p-type semiconductor region (P2) adjacent to the n-type substrate region N1 can be lowered while the impurity concentration of the p-type semiconductor region (P4) adjacent to the n-type semiconductor regions N2 and N3 remains held high. This can be said even where the concentration distribution that the impurity concentration is lowered as the depth from the front surface of the semiconductor substrate 1 becomes deep is reached as shown in FIGS. 22 and 23. The effect of enhancing a breakdown voltage can therefore be enhanced.

Such a relationship of the impurity concentration distribution between the p-type semiconductor region P2 and the p-type semiconductor region P4 can be mentioned even with respect to the relationship of impurity concentration distribution between the p-type semiconductor region P3 and the p-type semiconductor region P5. Since the p-type semiconductor regions P2 and P4 are however formed on the front surface side of the semiconductor substrate 1, such a concentration distribution that the impurity concentration is lowered as the depth from the front surface of the semiconductor substrate 1 becomes deep can be reached. On the other hand, since the p-type semiconductor regions P3 and P5 are formed on the back surface side of the semiconductor substrate 1, such a concentration distribution that the impurity concentration is lowered as the depth from the back surface of the semiconductor substrate 1 becomes deep can be reached.

Thus, in the present embodiment, the respective impurity concentrations of the semiconductor regions (N2, N3, N4, N5, P1, P2, P3, P4 and P5) that configure the semiconductor substrate 1 are allowed to have such impurity concentration distributions that the impurity concentrations are lowered as the depth from the major surface (front or back surface) of the semiconductor substrate 1 becomes deep, as in the concentration distributions shown in FIGS. 22 and 23 as well as to be constant within the respective semiconductor regions.

In the present embodiment, the p-type semiconductor region P2 of the low impurity concentration and the p-type semiconductor region P4 of the high impurity concentration are dared to be formed in the divided fashion in the manufacturing process. Therefore, a surface concentration (impurity concentration at the surface of the p-type semiconductor region P4) $\alpha_1$ of the p-type semiconductor region P4 is higher than a surface concentration (impurity concentration at the surface of the p-type semiconductor region P2) $\alpha_2$ of the p-type semiconductor region P2. Preferably, the surface concentration $\alpha_1$ of the p-type semiconductor region P4 ranges from over 50 times to under 5000 times the surface concentration $\alpha_2$ of the p-type semiconductor region P2 (i.e., $\alpha_2 \times 50 < \alpha_1 < \alpha_2 \times 5000$). The surface concentration $\alpha_1$ of the p-type semiconductor region P4 and the surface concentration $\alpha_2$ of the p-type semiconductor region P2 are shown in the graph of FIG. 23. Setting the surface concentration $\alpha_1$ of the p-type semiconductor region P4 to 50 or more times the surface concentration $\alpha_2$ of the p-type semiconductor region P2 (i.e., $\alpha_2 \times 50 < \alpha_1$) makes it possible to increase the difference in impurity concentration between the p-type semiconductor region P2 and the p-type semiconductor region P4 and adequately obtain the effect of enhancing the breakdown voltage and the effect of suppressing (preventing) the failure in commutation. Also setting the surface concentration $\alpha_1$ of the p-type semiconductor region P4 to under 5000 times the surface concentration $\alpha_2$ of the p-type semiconductor region P2 (i.e., $\alpha_1 < \alpha_2 \times 5000$) makes it possible to ensure the impurity concentration of the p-type semiconductor region P2 to some extent while achieving the enhancement of the breakdown voltage. It is therefore possible to appropriately suppress the spread of a depletion layer in the p-type semiconductor region P2.

Here, the surface concentration $\alpha_1$ of the p-type semiconductor region P4 corresponds to the impurity concentration of the p-type semiconductor region P4 at the surface (first major surface) of the semiconductor substrate 1. Specifically, the surface concentration $\alpha_1$ of the p-type semiconductor region P4 corresponds to an impurity concentration in a region (region in which the depth from the front surface of the semiconductor substrate 1 falls within a range from approximately 0 to 2 μm) lying in the neighborhood of the front surface of the semiconductor substrate 1, of the p-type semiconductor region P4. For example, the impurity concentration of a region PS1 shown in FIG. 21 can be assumed to be the surface concentration $\alpha_1$ of the p-type semiconductor region P4. The surface concentration $\alpha_2$ of the p-type semiconductor region P2 corresponds to the impurity concentration of the p-type semiconductor region P2 at the surface (first major surface) of the semiconductor substrate 1. Specifically, the surface concentration $\alpha_2$ of the p-type semiconductor region P2 corresponds to an impurity concentration in a region (region in which the depth from the front surface of the semiconductor substrate 1 falls within a range from approximately 0 to 2 μm) lying in the neighborhood of the front surface of the semiconductor substrate 1, of the p-type semiconductor region P2. For example, the impurity concentration of a region PS2 shown in FIG. 21 can be assumed to be the surface concentration $\alpha_2$ of the p-type semiconductor region P2.

In the present embodiment, the surface concentration (impurity concentration at the surface of the p-type semiconductor region P2) $\alpha_2$ of the p-type semiconductor region P2 is higher than an impurity concentration $\alpha_3$ of the n-type substrate region N1. Preferably, the surface concentration $\alpha_2$ of the p-type semiconductor region P2 ranges from over 5 times to under 500 times the impurity concentration $\alpha_3$ of the n-type substrate region N1 (i.e., $\alpha_3 \times 5 < \alpha_2 < \alpha_3 \times 500$). The impurity concentration $\alpha_3$ of the n-type substrate region N1 is shown in the graph of FIG. 23. Setting the surface concentration $\alpha_2$ of the p-type semiconductor region P2 to 500 or less times the impurity concentration $\alpha_3$ of the n-type substrate region N1 (i.e., $\alpha_2 < \alpha_3 \times 500$) makes it possible to relax the concentration of an electric field and enhance the effect of improving the breakdown voltage. Also setting the surface concentration $\alpha_2$ of the p-type semiconductor region P2 to over 5 times the impurity concentration $\alpha_3$ of the n-type substrate region N1 (i.e., $\alpha_3 \times 5 < \alpha_2$) makes it possible to ensure the impurity concentration of the p-type semiconductor region P2 to some extent while achieving the enhancement of the breakdown voltage. It is therefore possible to appropriately suppress the spread of the depletion layer in the p-type semiconductor region P2.

Here, the impurity concentration $\alpha_3$ of the n-type substrate region N1 corresponds to the impurity concentration of a region of the n-type substrate region N1, which is spaced apart from the p-type semiconductor regions P1, P2, P3, P4 and P5 and the n-type semiconductor regions N2, N3, N4 and N5 by some degree and becomes approximately constant in impurity concentration. The impurity concentration $\alpha_3$ of the n-type substrate region N1 is approximately the same as the impurity concentration of the semiconductor substrate 1W at the stage prior to the formation of the p-type semiconductor regions P1, P2, P3, P4, P5 and the n-type semiconductor regions N2, N3, N4 and N5.

Incidentally, when reference is made to an impurity concentration of a p-type semiconductor region in which p-type and n-type impurities exist in mixed form, it means an effective p-type impurity concentration obtained by subtracting the concentration of the n-type impurity actually contained therein from the concentration of the p-type impurity actually contained therein. When reference is made to an impurity concentration of an n-type semiconductor region in which p-type and n-type impurities exist in mixed form, it means an effective n-type impurity concentration obtained by subtracting the concentration of the p-type impurity actually contained therein from the concentration of the n-type impurity actually contained therein.

In the present embodiment, the p-type semiconductor region P3 of the low impurity concentration and the p-type semiconductor region P5 of the high impurity concentration are dared to be formed in the divided fashion in the manufacturing process. Therefore, the surface concentration of the p-type semiconductor region P5 is preferably set to be over 50 times and under 5000 times the virtual surface concentration of the p-type semiconductor region P3 where no p-type semiconductor region P5 is formed. It is thus possible to appropriately obtain the effect of enhancing the breakdown voltage and the effect of suppressing (preventing) the failure in commutation.

Figure 25:
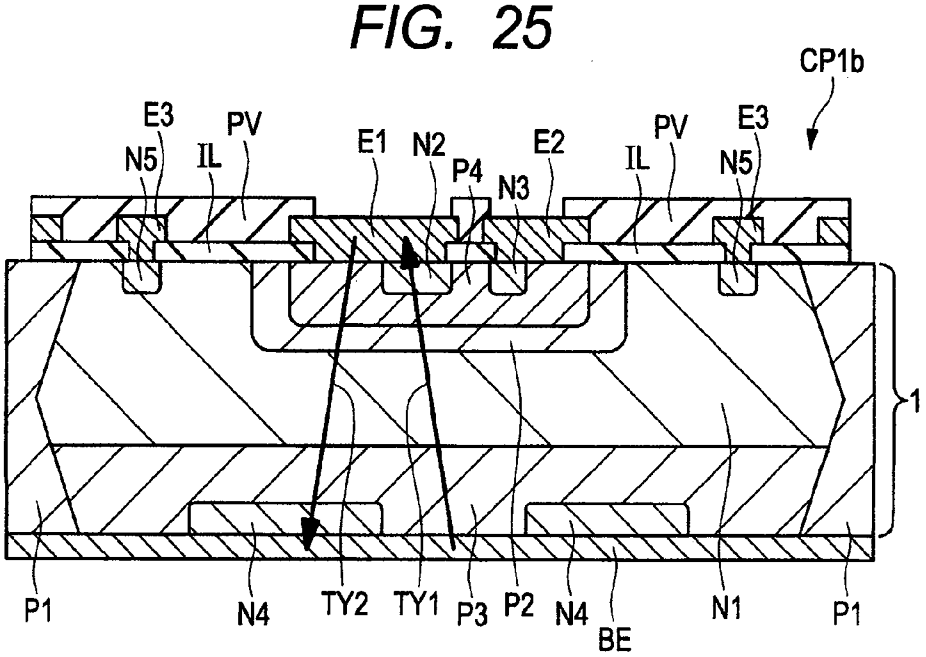
FIG. 25 is a sectional view of a semiconductor device showing a second modification of the one embodiment of the present invention.

Here, the term "surface concentration of p-type semiconductor region P5" corresponds to the impurity concentration of the p-type semiconductor region P5 at the back surface (second major surface) of the semiconductor substrate 1. Specifically, the surface concentration of the p-type semiconductor region P5 corresponds to an impurity concentration in a region (region in which the depth from the back surface of the semiconductor substrate 1 falls within a range from approximately 0 to 2 μm) lying in the neighborhood of the back surface of the semiconductor substrate 1, of the p-type semiconductor region P5. On the other hand, the term "virtual surface concentration of the p-type semiconductor region P3 where no p-type semiconductor region P5 is formed" corresponds to an impurity concentration in a region (region in which the depth from the back surface of the semiconductor substrate 1 falls within a range from approximately 0 to 2 μm) lying in the neighborhood of the back surface of the semiconductor substrate 1, of the p-type semiconductor region P3 where the formation of the p-type semiconductor region P5 is omitted (in this case, the region corresponding to the p-type semiconductor region P5 also serves as part of the p-type semiconductor region P3 and such a structure as shown in FIG. 25 to be described later is taken). Therefore, the "virtual surface concentration of the p-type semiconductor region P3 where no p-type semiconductor region P5 is formed" can be obtained if except for the omission of the formation of the p-type semiconductor region P5, a semiconductor device is manufactured in a manufacturing process similar to the semiconductor device CP1 and the impurity concentration of a p-type semiconductor region P3 in a region in the vicinity of the back surface of a semiconductor substrate 1 of the manufactured semiconductor device is measured. There is also a case in which in the semiconductor device formed with the p-type semiconductor regions P3 and P5, an impurity concentration distribution for the p-type semiconductor regions P5 and P3 in the direction of the depth of the semiconductor substrate 1 as viewed from the back surface thereof is measured and the "virtual surface concentration of the p-type semiconductor region P3 where no p-type semiconductor region P5 is formed" can be determined by simulation, based on the impurity concentration distribution.

Figure 24:
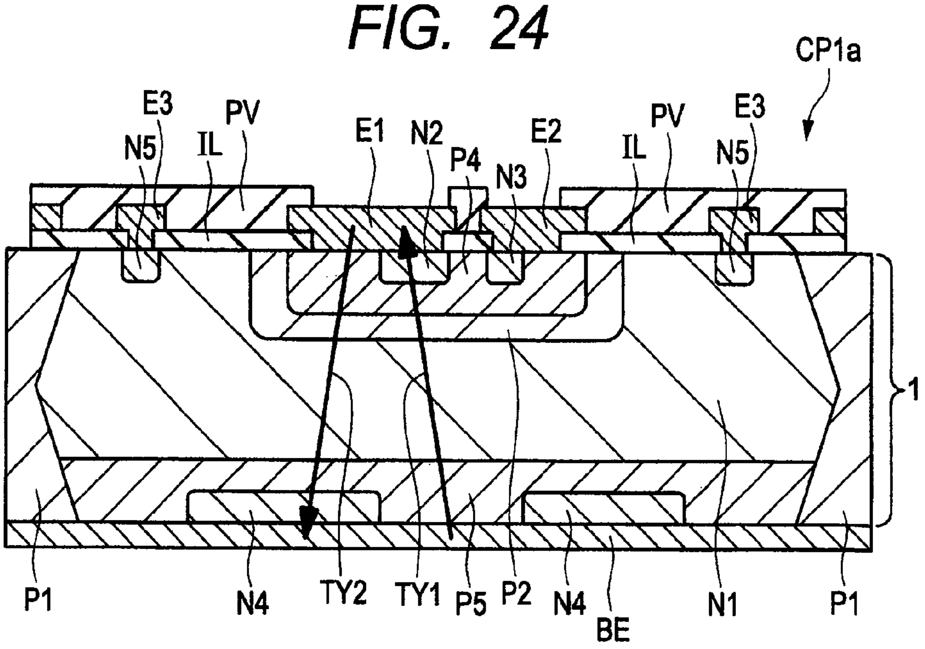
FIG. 24 is a sectional view of a semiconductor device showing a first modification of the one embodiment of the present invention.
Figure 26:
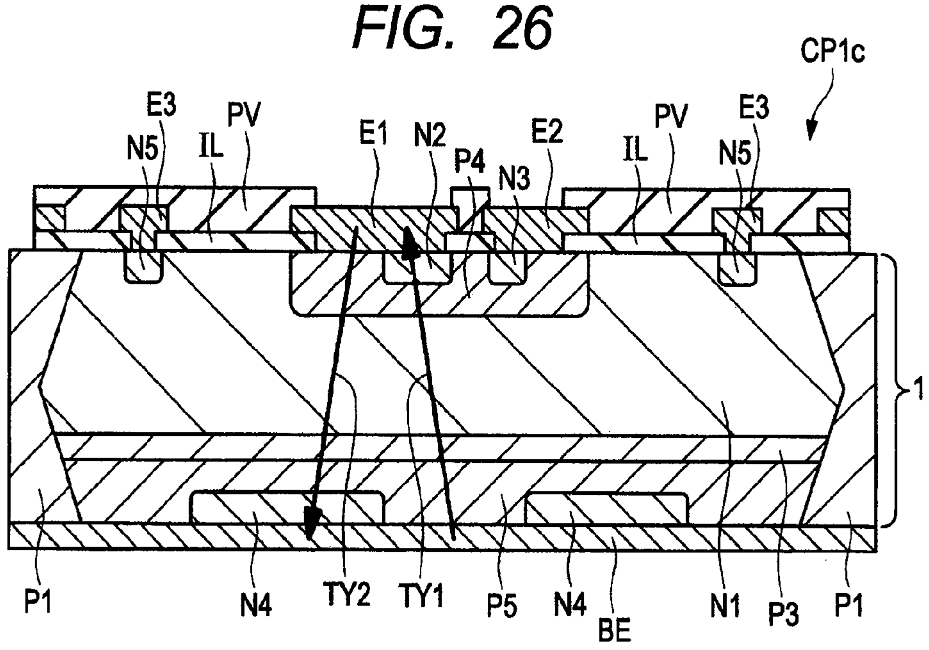
FIG. 26 is a sectional view of a semiconductor device showing a third modification of the one embodiment of the present invention.
Figure 27:
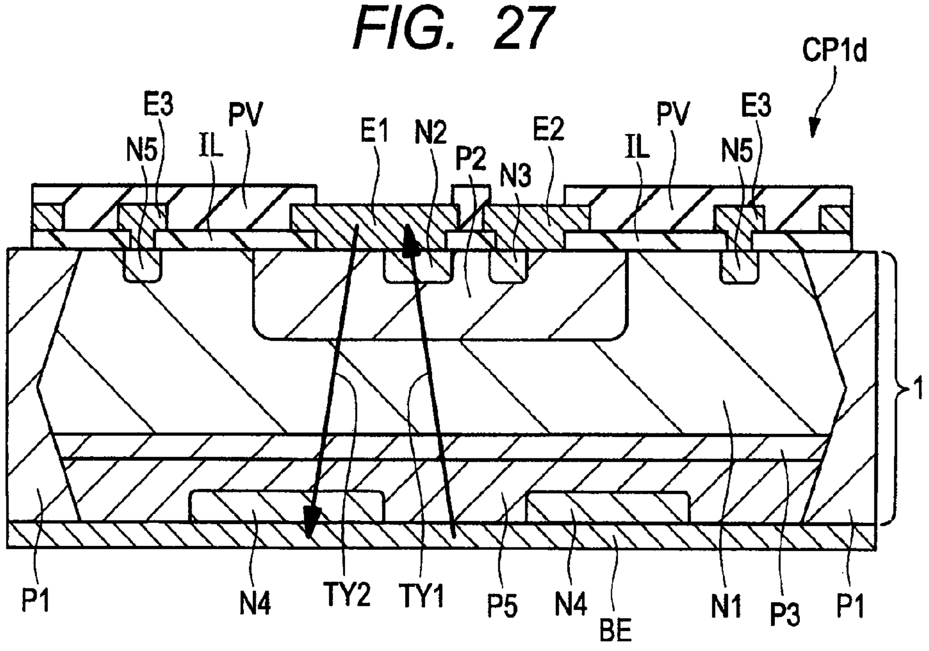
FIG. 27 is a sectional view of a semiconductor device showing a fourth modification of the one embodiment of the present invention.

FIG. 24 is a sectional view of a semiconductor device CP1*a* according to a first modification of the present embodiment, FIG. 25 is a sectional view of a semiconductor device CP1*b* according to a second modification of the present embodiment, FIG. 26 is a sectional view of a semiconductor device CP1*c* according to a third modification of the present embodiment, and FIG. 27 is a sectional view of a semiconductor device CP1*d* according to a fourth modification of the present embodiment and shows a section corresponding to FIG. 14 and FIG. 2.

The semiconductor device CP1*a* according to the first modification shown in FIG. 24 corresponds to a case in which the formation of the p-type semiconductor region P3 is omitted from the semiconductor device CP1 shown in FIGS. 14 and 2. Thus, the region which serves as the p-type semiconductor region P3 in the semiconductor device CP1, serves as part of an n-type substrate region N1 in the semiconductor device CP1*a* according to the first modification. The semiconductor device CP1*b* according to the second modification shown in FIG. 25 corresponds to a case in which the formation of the p-type semiconductor region P5 is omitted from the semiconductor device CP1 shown in FIGS. 14 and 2. Thus, the region which serves as the p-type semiconductor region P5 in the semiconductor device CP1, serves as part of a p-type semiconductor region P3 in the semiconductor device CP1*b* according to the second modification. The semiconductor device CP1*c* according to the third modification shown in FIG. 26 corresponds to a case in which the formation of the p-type semiconductor region P2 is omitted from the semiconductor device CP1 shown in FIGS. 14 and 2. Thus, the region which serves as the p-type semiconductor region P2 in the semiconductor device CP1, serves as part of an n-type substrate region N1 in the semiconductor device CP1*c* according to the third modification. The semiconductor device CP1*d* according to the fourth modification shown in FIG. 27 corresponds to a case in which the formation of the p-type semiconductor region P4 is omitted from the semiconductor device CP1 shown in FIGS. 14 and 2. Thus, the region which serves as the p-type semiconductor region P4 in the semiconductor device CP1, serves as part of a p-type semiconductor region P2 in the semiconductor device CP1*d* according to the fourth modification. Here, it is necessary to adjust, in consideration of a balance between a breakdown voltage and suppression of a failure in commutation, the impurity concentration of a p-type semiconductor region P5 in the case of the semiconductor device CP1*a* according to the first modification shown in FIG. 24, the impurity concentration of the p-type semiconductor region P3 in the case of the semiconductor device CP1*b* according to the second modification shown in FIG. 25, the impurity concentration of a p-type semiconductor region P4 in the case of the semiconductor device CP1*c* according to the third modification shown in FIG. 26 and the impurity concentration of a p-type semiconductor region P2 in the case of the semiconductor device CP1*d* according to the fourth modification shown in FIG. 27.

The semiconductor devices CP1*a*, CP1*b*, CP1*c* and CP1*d* according to the first through fourth modifications shown in FIGS. 24 through 27 can respectively obtain the effect of enhancing the breakdown voltage and suppressing the failure in commutation as compared with the semiconductor device CP101 according to the first comparative example. Therefore, the semiconductor devices CP1*a*, CP1*b*, CP1*c* and CP1*d* according to the first through fourth modifications shown in FIGS. 24 through 27 are also effective.

However, in order to enhance the effect of improving the breakdown voltage and the effect of suppressing the failure in commutation as much as possible, configuring the p-type semiconductor regions on the electrode E1 side by the p-type semiconductor region P2 and the p-type semiconductor region P4 and configuring the p-type semiconductor regions on the back surface electrode BE side by the p-type semiconductor region P3 and the p-type semiconductor region P5 as in the semiconductor device CP1 shown in FIGS. 14 and 2 are extremely effective. Therefore, the semiconductor device CP1 shown in FIGS. 14 and 2 is superior to the semiconductor devices CP1*a*, CP1*b*, CP1*c* and CP1*d* according to the first through fourth modifications shown in FIGS. 24 through 27 in terms of the compatibility between the enhancement of the breakdown voltage and the suppression of the failure in commutation.

While the invention made above by the present inventors has been specifically described on the basis of the preferred embodiments, the present invention is not limited to the embodiments referred to above. It is needless to say that various changes can be made thereto within the scope not departing from the gist thereof.

What is claimed is:

1. A semiconductor device comprising:

a semiconductor substrate of a first conductivity type, having a first major surface and a second major surface lying on the side opposite to the first major surface;

a first semiconductor region of a second conductivity type formed on the side of the first major surface of the semiconductor substrate;

a second semiconductor region of a second conductivity type formed on the side of the first major surface of the semiconductor substrate to be internally included in the first semiconductor region;

third and fourth semiconductor regions of a first conductivity type formed on the side of the first major surface of the semiconductor substrate to be internally included in the second semiconductor region and spaced apart from each other;

a fifth semiconductor region of a second conductivity type formed on the side of the second major surface of the semiconductor substrate;

a sixth semiconductor region of a first conductivity type formed on the side of the second major surface of the semiconductor substrate to be internally included in the fifth semiconductor region;

a first electrode formed over the first major surface of the semiconductor substrate to contact the second and third semiconductor regions;

a second electrode formed over the first major surface of the semiconductor substrate to contact the second and fourth semiconductor regions;

a third electrode over the second major surface of the semiconductor substrate to contact the fifth and sixth semiconductor regions; and a substrate region of a first conductivity type comprised of part of the semiconductor substrate and interposed between the first semiconductor region and the fifth semiconductor region, wherein a first thyristor is formed between the third electrode and the first electrode by the fifth semiconductor region, the substrate region, the first semiconductor region, the second semiconductor region and the third semiconductor region, wherein a second thyristor is formed between the first electrode and the third electrode by the second semiconductor region, the first semiconductor region, the substrate region, the fifth semiconductor region and the sixth semiconductor region, wherein the first thyristor and the second thyristor are opposite in the direction of currents flowing between the first electrode and the third electrode, and wherein the second semiconductor region is higher than the first semiconductor region in impurity concentration.

2. The semiconductor device according to claim 1, wherein the second electrode functions as a gate terminal.

3. The semiconductor device according to claim 2, which is a triac.

4. The semiconductor device according to claim 3, wherein the first conductivity type is an n type, and the second conductivity type is a p type.

5. The semiconductor device according to claim 4, further comprising a seventh semiconductor region which is interposed between the fifth semiconductor region and the substrate region in the semiconductor substrate and which is of a second conductivity type and lower than the fifth semiconductor region in impurity concentration, wherein the first thyristor is formed between the third electrode and the first electrode by the fifth semiconductor region, the seventh semiconductor region, the substrate region, the first semiconductor region, the second semiconductor region and the third semiconductor region, and wherein the second thyristor is formed between the first electrode and the third electrode by the second semiconductor region, the first semiconductor region, the substrate region, the seventh semiconductor region, the fifth semiconductor region and the sixth semiconductor region.

6. The semiconductor device according to claim 5, wherein an eighth semiconductor region of a second conductivity type is formed in an outer peripheral region of the semiconductor substrate.

7. The semiconductor device according to claim 6, wherein the impurity concentration of the second semiconductor region in the first major surface of the semiconductor substrate is higher than the impurity concentration of the first semiconductor region in the first major surface of the semiconductor substrate.

8. The semiconductor device according to claim 7, wherein the impurity concentration of the second semiconductor region in the first major surface of the semiconductor substrate is over 50 times and under 5000 times the impurity concentration of the first semiconductor region in the first major surface of the semiconductor substrate.

9. The semiconductor device according to claim 8, further comprising a ninth semiconductor region which is formed on the side of the first major surface of the semiconductor substrate between the first semiconductor region and the eighth semiconductor region and which is of a first conductivity type and higher than the substrate region in impurity concentration.

10. A method for manufacturing a semiconductor device, comprising the steps of:

(a) preparing a semiconductor substrate of a first conductivity type having a first major surface and a second major surface lying on the side opposite to the first major surface;

(b) after the step (a) above, diffusing an impurity of a second conductivity type into the semiconductor substrate from the side of the first major surface of the semiconductor substrate to thereby form a first semiconductor region of a second conductivity type on the side of the first major surface of the semiconductor substrate;

(c) after the step (b) above, diffusing an impurity of a second conductivity type into the semiconductor substrate from the side of the first major surface of the semiconductor substrate to thereby form on the side of the first major surface of the semiconductor substrate, a second semiconductor region being of a second conductivity type and having an impurity concentration higher than that of the first semiconductor region so as to be internally included in the first semiconductor region;

(d) after the step (c) above, diffusing an impurity of a first conductivity type into the semiconductor substrate from the side of the first major surface of the semiconductor substrate to thereby form on the side of the first major surface of the semiconductor substrate, third and fourth semiconductor regions being of a first conductivity type and spaced apart from each other so as to be internally included in the second semiconductor region;

(e) after the step (a) above, diffusing an impurity of a second conductivity type into the semiconductor substrate from the side of the second major surface of the semiconductor substrate to thereby form a fifth semiconductor region of a second conductivity type on the side of the second major surface of the semiconductor substrate;

(f) after the step (e) above, diffusing an impurity of a first conductivity type into the semiconductor substrate from the side of the second major surface of the semiconductor substrate to thereby form on the side of the second major surface of the semiconductor substrate, a sixth semiconductor region of a first conductivity type so as to be internally included in the fifth semiconductor region;

(g) after the steps (a), (b), (c), (d), (e) and (f) above, forming a first electrode brought into contact with the second and third semiconductor regions and a second electrode brought into contact with the second and fourth semiconductor regions over the first major surface of the semiconductor substrate; and (h) after the step (g) above, forming a third electrode brought into contact with the fifth and sixth semiconductor regions over the first major surface of the semiconductor substrate, wherein a first thyristor is formed between the third electrode and the first electrode by the fifth semiconductor region, the semiconductor substrate, the first semiconductor region, the second semiconductor region and the third semiconductor region, wherein a second thyristor is formed between the first electrode and the third electrode by the second semiconductor region, the first semiconductor region, the semiconductor substrate, the fifth semiconductor region and the sixth semiconductor region, and wherein the first thyristor and the second thyristor are opposite in the direction of currents flowing between the first electrode and the third electrode.

11. The method according to claim 10, wherein the second electrode functions as a gate terminal.

12. The method according to claim 11, wherein the semiconductor device is a triac.

13. The method according to claim 12, wherein the first conductivity type is an n type, and the second conductivity type is a p type.

14. The method according to claim 13, further comprising the step of:

(i) after the step (a) above and before the step (e) above, diffusing an impurity of a second conductivity type into the semiconductor substrate from the side of the second major surface of the semiconductor substrate to thereby form a seventh semiconductor region of a second conductivity type on the side of the second major surface of the semiconductor substrate, wherein in the step (e), the fifth semiconductor region higher in impurity concentration than the seventh semiconductor region is formed shallower than the seventh semiconductor region.

15. The method according to claim 14, wherein when the first, second, third, fourth, fifth, sixth and seventh semiconductor regions are formed in the steps (b), (c), (d), (e), (f) and (i), thermal diffusion of an impurity is used.

16. The method according to claim 15, further comprising a step of:

(j) after the step (a) above and before the steps (b), (c), (d), (e), (f), (g), (h) and (i) above, forming an eighth semiconductor region of a second conductivity type extending from the first major surface to the second major surface in the semiconductor substrate, wherein in the steps (b), (c) and (d) above, the first, second, third and fourth semiconductor regions are formed in a region surrounded with the eighth semiconductor region.

17. The method according to claim 16, wherein a thermal diffusion process conducted to form the first semiconductor region in the step (b), and a thermal diffusion process conducted to form the seventh semiconductor region in the step (i) are performed by the same heat treatment, wherein a thermal diffusion process conducted to form the second semiconductor region in the step (c), and a thermal diffusion process conducted to form the fifth semiconductor region in the step (e) are performed by the same heat treatment, and wherein a thermal diffusion process conducted to form the third and fourth semiconductor regions in the step (d), and a thermal diffusions process conducted to form the sixth semiconductor region in the step (f) are performed by the same heat treatment.

18. The method according to claim 17, wherein the step (b) comprises the steps of:

(b1) introducing an impurity into the neighborhood of the first major surface of the semiconductor substrate by ion implantation; and (b2) after the step (b1) above, diffusing the impurity introduced in the step (b1) into the inside of the semiconductor substrate by thermal diffusion to thereby form the first semiconductor region, wherein the step (c) comprises the steps of:

(c1) introducing an impurity into the neighborhood of the first major surface of the semiconductor substrate by ion implantation; and (c2) after the step (c1) above, diffusing the impurity introduced in the step (c1) into the inside of the semiconductor substrate by thermal diffusion to thereby form the second semiconductor region, and wherein an amount of dose for the ion implantation conducted in the step (b1) is greater than an amount of dose for the ion implantation conducted in the step (c1).

19. The method according to claim 18, wherein the amount of dose for the ion implantation conducted in the step (b1) is 10 to 5000 times the amount of dose for the ion implantation conducted in the step (c1).

20. The method according to claim 19, wherein the step (i) comprises the steps of:

(i1) introducing an impurity into the neighborhood of the second major surface of the semiconductor substrate by ion implantation; and (i2) after the step (i1) above, diffusing the impurity introduced in the step (i1) into the inside of the semiconductor substrate by thermal diffusion to thereby form the seventh semiconductor region, wherein the step (e) comprises the steps of:

(e1) introducing an impurity into the neighborhood of the second major surface of the semiconductor substrate by ion implantation; and (e2) after the step (e1) above, diffusing the impurity introduced in the step (e1) into the inside of the semiconductor substrate by thermal diffusion to thereby form the fifth semiconductor region, and wherein an amount of dose for the ion implantation conducted in the step (e1) is greater than an amount of dose for the ion implantation conducted in the step (i1).

21. The method according to claim 20, wherein the amount of dose for the ion implantation conducted in the step (e1) is 10 to 5000 times the amount of dose for the ion implantation conducted in the step (i1).

* * * * *